United States Patent
Ishikawa et al.

(10) Patent No.: US 11,355,350 B2
(45) Date of Patent: Jun. 7, 2022

(54) ETCHING METHOD, SUBSTRATE PROCESSING APPARATUS, AND SUBSTRATE PROCESSING SYSTEM

(71) Applicant: Tokyo Electron Limited, Tokyo (JP)

(72) Inventors: Shinya Ishikawa, Miyagi (JP); Kenta Ono, Miyagi (JP); Maju Tomura, Miyagi (JP); Masanobu Honda, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/114,508

(22) Filed: Dec. 8, 2020

(65) Prior Publication Data
US 2021/0193477 A1 Jun. 24, 2021

(30) Foreign Application Priority Data

Dec. 20, 2019 (JP) .............................. JP2019-230465
Apr. 9, 2020 (JP) .............................. JP2020-070452

(51) Int. Cl.
| | | |
|---|---|---|
| H01L 21/311 | (2006.01) |
| H01L 21/02 | (2006.01) |
| H01L 21/67 | (2006.01) |
| C23C 16/24 | (2006.01) |
| B05D 1/00 | (2006.01) |
| C23C 16/56 | (2006.01) |
| B05D 3/14 | (2006.01) |
| C23C 16/455 | (2006.01) |
| H01J 37/32 | (2006.01) |

(52) U.S. Cl.
CPC .......... *H01L 21/31138* (2013.01); *B05D 1/62* (2013.01); *B05D 3/145* (2013.01); *C23C 16/24* (2013.01); *C23C 16/45536* (2013.01); *C23C 16/56* (2013.01); *H01L 21/0228* (2013.01); *H01L 21/02274* (2013.01); *H01L 21/31116* (2013.01); *H01L 21/31144* (2013.01); *H01L 21/67069* (2013.01); *H01J 37/32183* (2013.01); *H01J 2237/334* (2013.01); *H01J 2237/3321* (2013.01)

(58) Field of Classification Search
None
See application file for complete search history.

(56) References Cited

U.S. PATENT DOCUMENTS

| | | | | |
|---|---|---|---|---|
| 5,406,111 A | * | 4/1995 | Sun ..................... | H01L 27/0251 257/497 |
| 6,827,869 B2 | * | 12/2004 | Podlesnik ........... | H01L 21/3065 216/17 |
| 7,261,825 B2 | * | 8/2007 | Metzger .............. | B81C 1/00142 216/2 |
| 10,923,360 B2 | * | 2/2021 | Katsunuma ....... | H01L 21/02244 |
| 2002/0182819 A1 | * | 12/2002 | Schrems ........... | H01L 29/66181 438/386 |

(Continued)

*Primary Examiner* — Shamim Ahmed
(74) *Attorney, Agent, or Firm* — Xsensus LLP

(57) ABSTRACT

A system, apparatus and method enable etching of a layer of a substrate with reduced etching on the surface of a side wall of the layer. The etching method includes forming a protective layer on a surface of the side wall defining a recess in the layer. The protective layer contains phosphorus. The etching method further includes etching the layer in one or more additional cycles so as to increase a depth of the recess after the forming the protective layer.

20 Claims, 12 Drawing Sheets

(56) References Cited

U.S. PATENT DOCUMENTS

| | | | |
|---|---|---|---|
| 2006/0228864 A1* | 10/2006 | Chen | H01L 29/66181 |
| | | | 438/400 |
| 2013/0341702 A1* | 12/2013 | Kar | H01L 29/1045 |
| | | | 257/324 |
| 2016/0307775 A1* | 10/2016 | Lee | H01L 21/31144 |
| 2018/0286707 A1 | 10/2018 | Hudson et al. | |

* cited by examiner

ETCHING METHOD, SUBSTRATE PROCESSING APPARATUS, AND SUBSTRATE PROCESSING SYSTEM

CROSS-REFERENCE TO RELATED APPLICATIONS

This application claims priority to Japanese Patent Application Nos. 2019-230465 filed on Dec. 20, 2019 and 2020-070452 filed on Apr. 9, 2020, the entire disclosures of each of which are incorporated herein by reference.

BACKGROUND

Technical Field

Exemplary embodiments of the present disclosure relate to an etching method, a substrate processing apparatus, and a substrate processing system.

Description of the Background

Manufacturing electronic devices includes plasma etching of layers on substrates. Plasma etching is used for, for example, silicon-containing layers. Plasma etching of silicon-containing layers uses process gases containing fluorocarbon gases. Such plasma etching is described in Patent Literature 1.

CITATION LIST

Patent Literature

Patent Literature 1: U.S. Patent Application Publication No. 2018/0286707

BRIEF SUMMARY

The present disclosure is directed to a technique for etching of a layer on a substrate with reduced etching on the surface of a side wall.

An etching method according to an exemplary embodiment includes forming a protective layer on a surface of a side wall defining a recess in a layer of a substrate. The protective layer contains phosphorus. The etching method further includes etching the layer to increase a depth of the recess after the forming the protective layer.

The technique according to an exemplary embodiment enables etching of a layer on a substrate while suppressing etching on the surface of a side wall.

DETAILED DESCRIPTION

Figure 1:
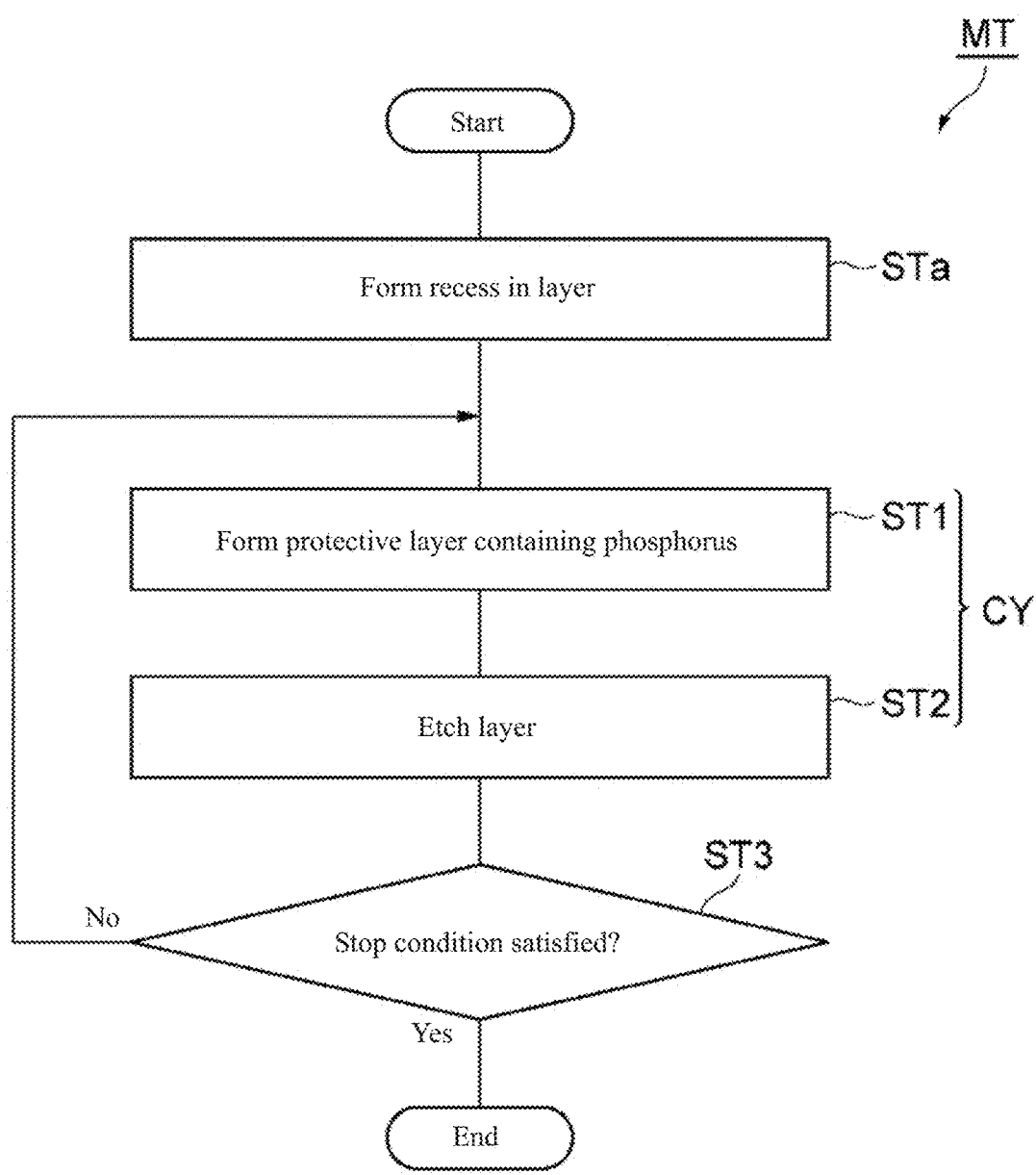
FIG. 1 is a flowchart of an etching method according to an exemplary embodiment.

Exemplary embodiments will now be described.

An etching method according to one exemplary embodiment includes forming a protective layer on a surface of a side wall defining a recess in a layer of a substrate. As described herein the substrate includes the layer and may include on or more additional layers, as well as a masking layer, and one or more layers that underlie the layer(s). In an exemplary embodiment, the protective layer contains phosphorus. However, the protective layer can contain one or more other elements or compounds. The protective layer can also contain phosphorous and one or more other elements or compounds. The etching method further includes etching the layer to increase a depth of the recess after the forming of the protective layer.

In the above embodiment, the substrate has the side wall surface being protected by the protective layer when the layer on the substrate is etched. While the term "on the substrate" is used herein, it should be understood that the substrate includes the layer, and perhaps other layers/layers such as a masking layer, an underlying region, and possibly additional layers between the masking layer and the underlying region. The protective layer contains phosphorus and is highly resistant to a chemical species used for etching the layer. The above embodiment thus enables etching of the layer on the substrate with reduced etching of the side wall surface. The etching of the layer may include plasma etching.

In one exemplary embodiment, the forming the protective layer may include forming a precursor layer on the surface of the side wall with a first gas, and forming the protective layer from the precursor layer with a second gas. In this embodiment, the first gas or the second gas may contain phosphorus.

In one exemplary embodiment, a plurality of layer deposition cycles each including the forming the precursor layer and the forming the protective layer from the precursor layer may be performed sequentially. In one exemplary embodiment, purging may be performed in an internal space of a chamber accommodating the substrate between the forming the precursor layer and the forming the protective layer, and between the forming the protective layer and the forming the precursor layer.

In one exemplary embodiment, the plurality of layer deposition cycles may include at least one layer deposition cycle in which the forming the precursor layer is performed under a condition different from a condition under which the forming the precursor layer is performed in at least another one of the plurality of layer deposition cycles.

In one exemplary embodiment, the plurality of layer deposition cycles may include at least one layer deposition cycle in which the forming the protective layer from the precursor layer is performed under a condition different from a condition under which the forming the protective layer from the precursor layer is performed in at least another one of the plurality of layer deposition cycles.

In one exemplary embodiment, the first gas may contain a phosphorus-containing substance. The second gas may contain $H_2O$, an inorganic compound with an N—H bond, a carbon-containing substance, a silicon-containing substance, or a phosphorus-containing substance.

In one exemplary embodiment, the first gas may contain a carbon-containing substance or a silicon-containing substance. The second gas may contain a phosphorus-containing substance.

In one exemplary embodiment, the first gas may contain a phosphorus-containing substance. The second gas may contain at least one of $H_2$, $O_2$, or $N_2$. The protective layer may be formed from the precursor layer receiving a chemical species in plasma generated from the second gas.

In one exemplary embodiment, the phosphorus-containing substance contained in the first gas may include a phosphoryl compound, a phosphine substance, a phosphorane compound, a phosphaalkene compound, a phosphaalkyne compound, or a phosphazene compound.

In one exemplary embodiment, the phosphorus-containing substance contained in the second gas may include a phosphoryl compound, a phosphine substance, a phosphorane compound, a phosphaalkene compound, a phosphaalkyne compound, or a phosphazene compound.

In one exemplary embodiment, the protective layer may be formed by chemical vapor deposition with a layer deposition gas containing a phosphorus-containing substance.

In one exemplary embodiment, the phosphorus-containing substance in the layer deposition gas may include a phosphoryl compound, a phosphine substance, a phosphorane compound, a phosphaalkene compound, a phosphaalkyne compound, or a phosphazene compound.

In one exemplary embodiment, the layer deposition gas may further contain a carbon-containing substance, a silicon-containing substance, $H_2$, $O_2$, $H_2O$, $N_2$, an inorganic compound with an N—H bond, or a noble gas.

In one exemplary embodiment, a plurality of cycles each including the forming the protective layer and the etching the layer may be performed sequentially.

In one exemplary embodiment, the plurality of cycles may include at least one cycle in which the forming the protective layer is performed under a condition different from a condition under which the forming the protective layer is performed in at least another one of the plurality of cycles.

In one exemplary embodiment, the plurality of cycles may include at least one cycle in which the etching the layer is performed under a condition different from a condition under which the etching the layer is performed in at least another one of the plurality of cycles.

In one exemplary embodiment, the layer to be etched may include a silicon-containing layer or an organic layer.

A substrate processing apparatus according to another exemplary embodiment includes a chamber, a substrate support, a controllable gas supply, and a controller. The substrate support supports a substrate in the chamber. The controllable gas supply supplies a gas into the chamber. The controller controls the controllable gas supply. The controller controls the controllable gas supply to supply one or more gases into the chamber to form a protective layer containing phosphorus on a surface of a side wall defining a recess in the substrate supported on the substrate support. The controller controls the controllable gas supply to supply a process gas to etch a layer on the substrate to increase a depth of the recess after the protective layer is formed.

A substrate processing system according to still another exemplary embodiment includes a layer deposition apparatus and a substrate processing apparatus. The layer deposition apparatus forms a protective layer containing phosphorus on a surface of a side wall defining a recess in a substrate. The substrate processing apparatus etches a layer on the substrate to increase a depth of the recess after the protective layer is formed.

Exemplary embodiments will now be described in detail with reference to the drawings. In the drawings, similar or corresponding components are indicated by like reference numerals. The embodiments are illustrated by way of example and not by way of limitation in the accompanying drawings that are not to scale unless otherwise indicated.

Figure 2:
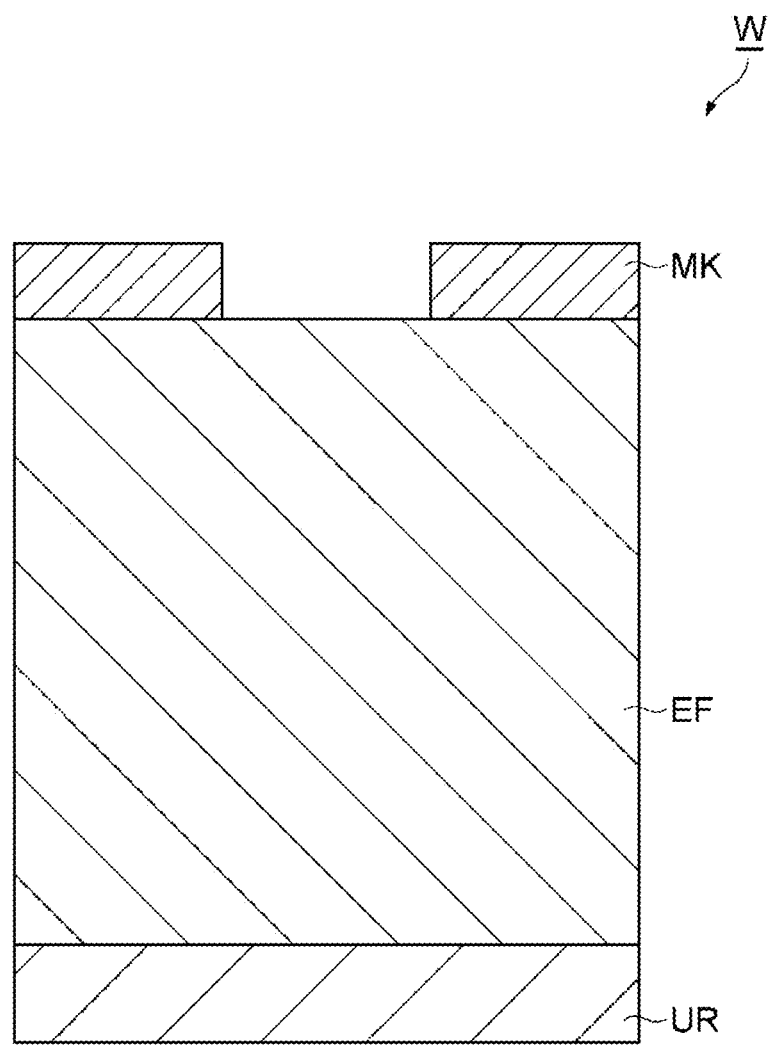
FIG. 2 is a partially enlarged cross-sectional view of an exemplary substrate.

FIG. 1 is a flowchart of an etching method according to an exemplary embodiment. The etching method shown in FIG. 1 (hereinafter referred to as the method MT) is used for etching a layer on a substrate. FIG. 2 is a partially enlarged cross-sectional view of an exemplary substrate. A substrate W shown in FIG. 2 includes a layer EF. The substrate W may further include an underlying region UR and a mask MK.

The layer EF is on the underlying region UR. The mask MK is on the layer EF. The mask MK is patterned, or in other words, the mask MK has one or more openings. The substrate W has side wall surfaces and bottom surfaces defining one or more recesses corresponding to the openings. The substrate W shown in FIG. 2 includes the mask MK defining the side wall surfaces and the layer EF defining the bottom surfaces. The layer EF is partially exposed through the openings in the mask MK. The layer EF may be formed from any material, and may be, fir example, a silicon-containing layer or an organic layer. In an exemplary embodiment, the layer EF may also be formed from a dielectric. The mask MK may be formed from any material for selective etching of the layer EF with respect to the mask MK in step ST2 (described later).

A first exemplary substrate W includes an organic layer as the layer EF. The first exemplary substrate W includes the mask MK formed from a silicon-containing layer. The silicon-containing layer is, for example, an antireflective layer containing silicon.

A second exemplary substrate W includes, as the layer EF, a low-dielectric-constant layer containing silicon, carbon, oxygen, and hydrogen, or in other words, a SiCOH layer. The second exemplary substrate W includes the mask MK formed from a metal-containing layer, such as a tungsten-containing layer or a titanium-containing layer. The mask MK in the second exemplary substrate W may be formed from a silicon nitride layer, a polysilicon layer, or an organic layer such as a photoresist layer.

A third exemplary substrate W includes a polycrystalline silicon layer as the layer EF. The third exemplary substrate W includes the mask MK formed from a metal-containing layer, such as a tungsten-containing layer or a titanium-containing layer. The mask MK in the third exemplary substrate W may be, for example, formed from a silicon oxide layer, a silicon nitride layer, or an organic layer such as a photoresist layer.

A fourth exemplary substrate W includes a silicon-containing layer as the layer EF. The silicon-containing layer may be, for example, a silicon-containing dielectric layer. The silicon-containing layer may be a single layer. The silicon-containing layer may be a multilayer including at least one silicon-containing dielectric layer. The silicon-containing layer is, for example, a multilayer including silicon oxide layers, silicon nitride layers, or an alternate stack of silicon oxide layers and silicon nitride layers, or a multilayer including an alternate stack of silicon oxide layers and polycrystalline silicon layers. The fourth exemplary substrate W includes the mask MK formed from, for example, an organic layer, a metal-containing layer, or a polysilicon layer. The organic layer is, for example, an amorphous carbon layer, a spin-on-carbon layer, or a photoresist layer. The metal-containing layer is formed from, for example, tungsten or tungsten carbide.

Figure 3:
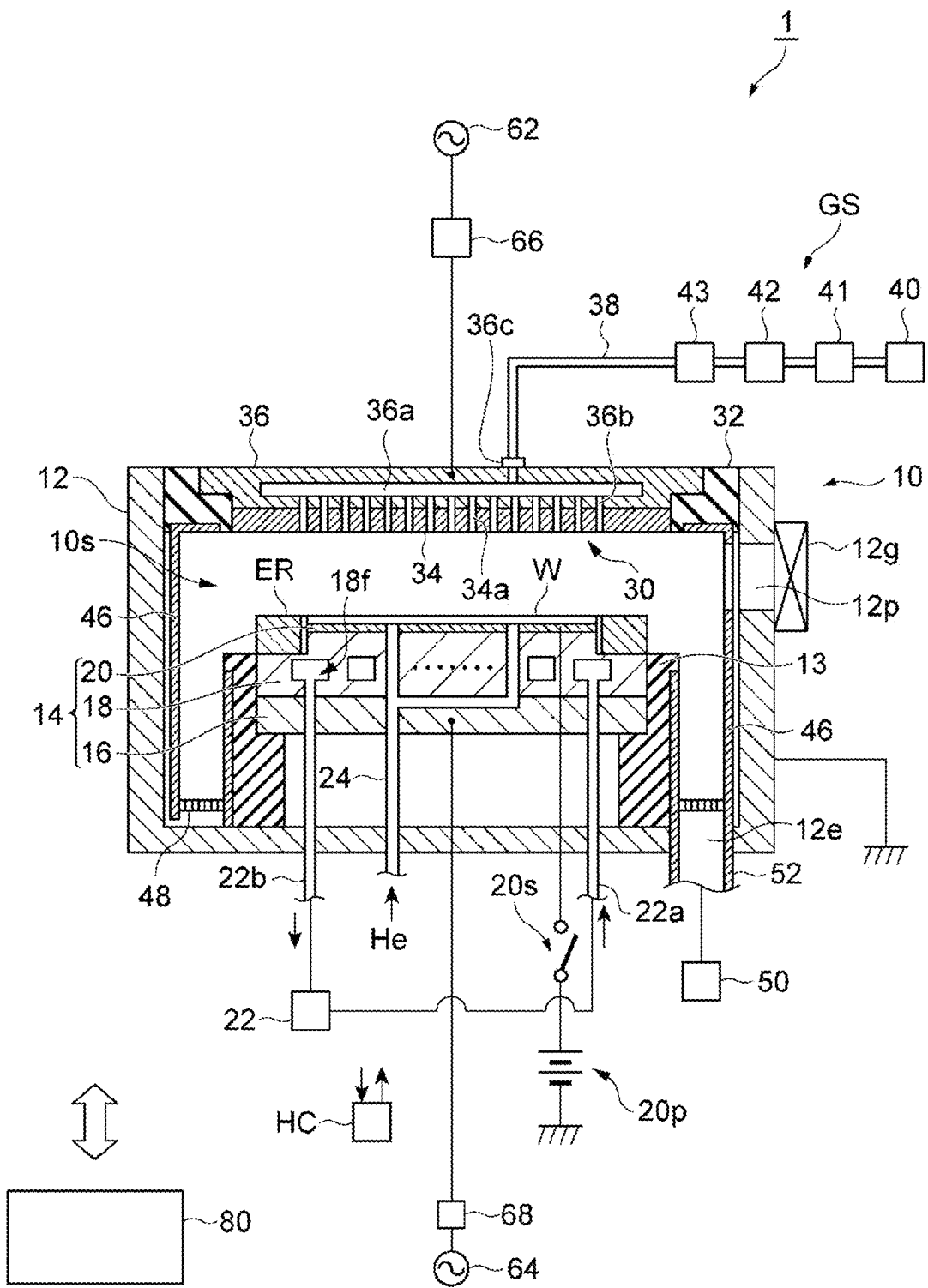
FIG. 3 is a schematic diagram of a substrate processing apparatus according to an exemplary embodiment.

In one embodiment, the method MT is implemented by a plasma processing apparatus. FIG. 3 is a schematic diagram of a substrate processing apparatus according to an exemplary embodiment. The plasma processing apparatus shown in FIG. 3 is a capacitively coupled plasma processing apparatus 1.

The plasma processing apparatus 1 includes a chamber 10 with an internal space 10s. The chamber 10 includes a chamber body 12, which is substantially cylindrical. The chamber body 12 has the internal space 10s and is formed from, for example, aluminum. The chamber body 12 has an inner wall coated with an anticorrosive layer, which may be formed from ceramic such as aluminum oxide or yttrium oxide.

The chamber body 12 has a side wall having a port 12p. The substrate W is transferred between the internal space 10s and the outside of the chamber 10 through the port 12p. The port 12p can be open and closed by a gate valve 12g on the side wall of the chamber body 12.

A support 13 is on the bottom of the chamber body 12. The support 13 is substantially cylindrical and is formed from an insulating material. The support 13 extends upward from the bottom of the chamber body 12 into the internal space 10s. The support 13 supports a substrate support 14. The substrate support 14 supports the substrate W in the chamber 10, or more specifically, in the internal space 10s.

The substrate support 14 includes a lower electrode 18 and an electrostatic chuck (ESC) 20. The lower electrode 18 and the ESC 20 are accommodated in the chamber 10. The substrate support 14 may further include an electrode plate 16 accommodated in the chamber 10. The electrode plate 16 is substantially disk-shaped and is formed from a conductive material such as aluminum. The lower electrode 18 is on the electrode plate 16. The lower electrode 18 is substantially disk-shaped and is formed from a conductive material such as aluminum. The lower electrode 18 is electrically coupled to the electrode plate 16.

Figure 4:
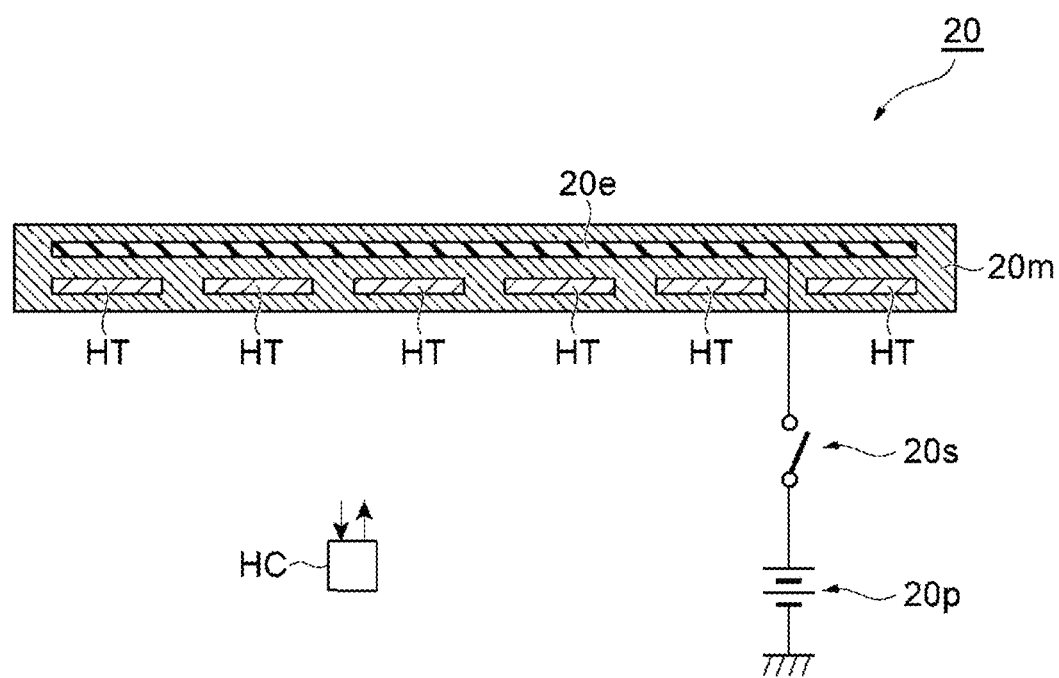
FIG. 4 is an enlarged cross-sectional view of an electrostatic chuck (ESC) included in the substrate processing apparatus according to the exemplary embodiment.

FIG. 4 is an enlarged cross-sectional view of the ESC included in the substrate processing apparatus according to the exemplary embodiment. Referring now to FIGS. 3 and 4, the ESC 20 is on the lower electrode 18. The substrate W is placed onto an upper surface of the ESC 20. The ESC 20 includes a body 20m and an electrode 20e. The body 20m is substantially disk-shaped and is formed from a dielectric.

The electrode 20e is a layer electrode located in the body 20m. The electrode 20e is coupled to a direct-current (DC) power supply 20p via a switch 20s. A voltage applied from the DC power supply 20p to the electrode 20e generates an electrostatic attraction between the ESC 20 and the substrate W. The electrostatic attraction causes the ESC 20 to attract and hold the substrate W.

The substrate support 14 may include one or more heaters HT. The heaters HT may include resistance heating elements. The plasma processing apparatus 1 may further include a heater controller HC. The heaters HT each generate heat in accordance with power individually provided from the heater controller HC and thus adjust the temperature of the substrate W on the substrate support 14. The heaters HT each serve as a temperature adjuster in the plasma processing apparatus 1. In one embodiment, the substrate support 14 includes multiple heaters HT The multiple heaters HT are accommodated in the ESC 20.

An edge ring ER is placed on the periphery of the substrate support 14 to surround an edge of the substrate W. The substrate W is placed in an area on the ESC 20 surrounded by the edge ring ER. The edge ring ER is used for more uniform processing across the surface of the substrate W with plasma. The edge ring ER may be formed from, but not limited to, silicon, silicon carbide, or quartz.

The lower electrode 18 has an internal channel 18f for carrying a heat-exchange medium (e.g., refrigerant) being supplied through a pipe 22a from a chiller unit 22 external to the chamber 10. The heat-exchange medium being supplied to the channel 18f returns to the chiller unit 22 through a pipe 22b. In the plasma processing apparatus 1, the temperature of the substrate W on the ESC 20 is adjusted through heat exchange between the heat-exchange medium and the lower electrode 18. The chiller unit 22 may also serve as the temperature adjuster in the plasma processing apparatus 1.

The plasma processing apparatus 1 includes a gas supply line 24. The gas supply line 24 supplies a heat-transfer gas (e.g., He gas) from a heat-transfer gas supply assembly into a space between the upper surface of the ESC 20 and a back surface of the substrate W.

The plasma processing apparatus 1 further includes an upper electrode 30 above the substrate support 14. The upper electrode 30 is supported on an upper portion of the chamber body 12 with a member 32 formed from an insulating material. The upper electrode 30 and the member 32 close a top opening of the chamber body 12.

The upper electrode 30 may include a ceiling plate 34 and a support member 36. The ceiling plate 34 has its lower surface exposed to and defining the internal space 10s. The ceiling plate 34 may be formed from a low resistance conductor or a semiconductor with less Joule heat. The ceiling plate 34 has multiple gas outlet holes 34a that are through-holes in the thickness direction.

The support member 36 supports the ceiling plate 34 in a detachable manner. The support member 36 is formed from a conductive material such as aluminum. The support member 36 has an internal gas-diffusion compartment 36a. The support member 36 has multiple gas holes 36b that extend downward from the gas-diffusion compartment 36a. The gas holes 36b communicate with the respective gas outlet holes 34a. The support member 36 has a gas inlet 36c that connects to the gas-diffusion compartment 36a and to a gas supply pipe 38.

The gas supply pipe 38 is connected to a set of gas sources 40 via a set of valves 41, a set of flow controllers 42, and a set of valves 43. The gas source set 40, the valve set 41, the flow controller set 42, and the valve set 43 form a controllable gas supply GS. The gas source set 40 includes multiple gas sources that are used with the method MT. When one or more gases used with the method MT are formed from a liquid, the gas sources include one or more gas sources each including a liquid source and a vaporizer. The valve sets 41 and 43 each include multiple open-close valves. The flow controller set 42 includes multiple flow controllers. The flow controllers in the flow controller set 42 are mass flow controllers or pressure-based flow controllers. The gas sources in the gas source set 40 are connected to the gas supply pipe 38 via the respective open-close valves in the valve set 41, via the respective flow controllers in the flow controller set 42, and via, the respective open-close valves in the valve set 43.

The plasma processing apparatus 1 may further include a shield 46 along the inner wall of the chamber body 12 in a detachable manner. The shield 46 also extends along the periphery of the support 13. The shield 46 prevents an etching product from accumulating on the chamber body 12. The shield 46 includes, for example, an aluminum member coated with an anticorrosive layer, which may be formed from ceramic such as yttrium oxide.

A baffle plate 48 is located between the support 13 and the side wall of the chamber body 12. The baffle plate 48 includes, for example, an aluminum member coated with an anticorrosive layer, which may be formed from ceramic such as yttrium oxide. The baffle plate 48 has multiple through-holes. The chamber body 12 has an outlet 12e in its bottom below the baffle plate 48. The outlet 12e is connected to an exhaust device 50 through an exhaust pipe 52. The exhaust device 50 includes a pressure control valve and a vacuum pump such as a turbomolecular pump.

The plasma processing apparatus 1 further includes a first radio-frequency (RF) power supply 62 and a second RF power supply 64. The first RF power supply 62 generates first RF power having a frequency suitable for generating plasma. The first RF power has a frequency ranging from, for example, 27 to 100 MHz. The first RF power supply 62 is coupled to the upper electrode 30 via an impedance matching circuit, or matcher 66. The matcher 66 includes a circuit for matching the output impedance of the first RF power supply 62 and the impedance of a load (the upper electrode 30). The first RF power supply 62 may be coupled to the lower electrode 18 via the matcher 66. The first RF power supply 62 serves as an exemplary plasma generator.

The second RF power supply 64 generates second RF power having a lower frequency than the first RF power. The second RF power, when used in addition to the first RF power, serves as bias RF power for drawing ions toward the substrate W. The second RF power has a frequency ranging from, for example, 400 kHz to 13.56 MHz. The second RF power supply 64 is coupled to the lower electrode 18 via an impedance matching circuit, or matcher 68, and the electrode plate 16. The matcher 68 includes a circuit for matching the output impedance of the second RF power supply 64 and the impedance of a load (the lower electrode 18).

The second RF power alone may be used to generate plasma, without the first RF power being used. In other words, a single RF power may be used to generate plasma. In this case, the second RF power may have a frequency higher than 13.56 MHz, or for example, 40 MHz. In this case, the plasma processing apparatus 1 may not include the first RF power supply 62 and the matcher 66. In this case, the second Rf power supply 64 serves as an exemplary plasma generator.

The controllable gas supply GS supplies a gas into the internal space 10s to generate plasma in the plasma processing apparatus 1. At least one of the first RF power or the second RF power is provided to form, between the upper electrode 30 and the lower electrode 18, an RF electric field that excites the gas to generate plasma.

The plasma processing apparatus 1 may further include a controller 80, which may be implemented as the processing circuitry 805, discussed later in reference to FIG. 12. The controller 80 may be a computer including a processor, a storage such as a memory, an input device, a display, and an input-output interface for signals. The controller 80 controls the components of the plasma processing apparatus 1. An operator can use the input device in the controller 80 to input a command or perform other operations for managing the plasma processing apparatus 1. The display in the controller 80 can display and visualize the operating state of the plasma processing apparatus 1. The storage in the controller 80 stores control programs and recipe data. The control program is executed by the processor in the controller 80 to perform the processing in the plasma processing apparatus 1. The processor in the controller 80 executes the control program to control the components of the plasma processing apparatus 1 in accordance with the recipe data, allowing the method MT to be implemented by the plasma processing apparatus 1.

Referring back to FIG. 1, the method MT will now be described in detail. The method MT used by the plasma processing apparatus 1 to process the substrate W shown in FIG. 2 will be described by way of example. The method MT may be used by another substrate processing apparatus. The method MT may be used to process another substrate.

The method MT is implemented with the substrate W placed on the substrate support 14. The method MT may be implemented while the internal space 10s of the chamber 10 is being decompressed without the substrate W being unloaded from the internal space 10s. In one embodiment, the method MT may start from step STa. In step STa, the layer EF is etched. The layer EF may be etched with plasma.

In step STa, plasma Pa is generated from a process gas in the chamber 10. To process the first exemplary substrate W described above including an organic layer serving as the layer EF on the substrate W, a process gas containing an oxygen-containing gas may be used in step STa. The oxygen-containing gas includes, for example, an oxygen gas, a carbon monoxide gas, or a carbon dioxide gas. In some embodiments, the process gas used in step STa to process the first exemplary substrate W may contain at least one of a nitrogen gas or a hydrogen gas.

To process the second exemplary substrate W described above including a low-dielectric-constant layer serving as the layer EF on the substrate W, a process gas containing a fluorine-containing gas may be used in step STa. The fluorine-containing gas includes a fluorocarbon gas. The fluorocarbon gas includes a $C_4F_8$ gas.

To process the third exemplary substrate W described above including a polycrystalline silicon layer serving as the layer EF on the substrate W, a process gas containing a halogen-containing gas may be used in step STa. The halogen-containing gas includes a HBr gas, a $Cl_2$ gas, or a $SF_6$ gas.

To process the fourth exemplary substrate W described above including a silicon oxide layer serving as the layer EF, a process gas containing a fluorocarbon gas pray be used in step STa. To process the fourth exemplary substrate W including a silicon nitride layer serving as the layer EF, a process gas containing a hydrofluorocarbon gas may be used in step STa. To process the fourth exemplary substrate W including a multilayer including an alternate stack of silicon oxide layers and silicon nitride layers serving as the layer EF, a process gas containing a fluorocarbon gas and a hydrofluorocarbon gas may be used in step STa. To process the fourth exemplary substrate W including a multilayer including an alternate stack of silicon oxide layers and polysilicon layers serving as the layer EF, a process gas containing a fluorocarbon gas and a halogen-containing gas may be used in step STa. The fluorocarbon gas includes a $CF_4$ gas, a $C_4F_6$ gas, or a $C_4F_8$ gas. The hydrofluorocarbon gas includes a $CH_3F$ gas. The halogen-containing gas includes a HBr gas or a $Cl_2$ gas.

Figure 5A:
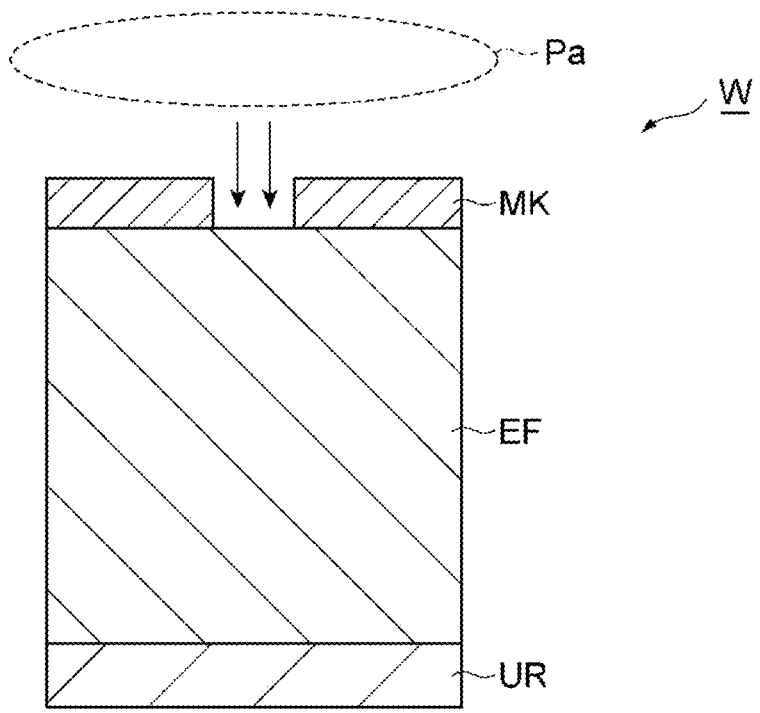
FIG. 5A is a diagram illustrating an exemplary step STa included in the etching method shown in FIG. 1.
Figure 5B:
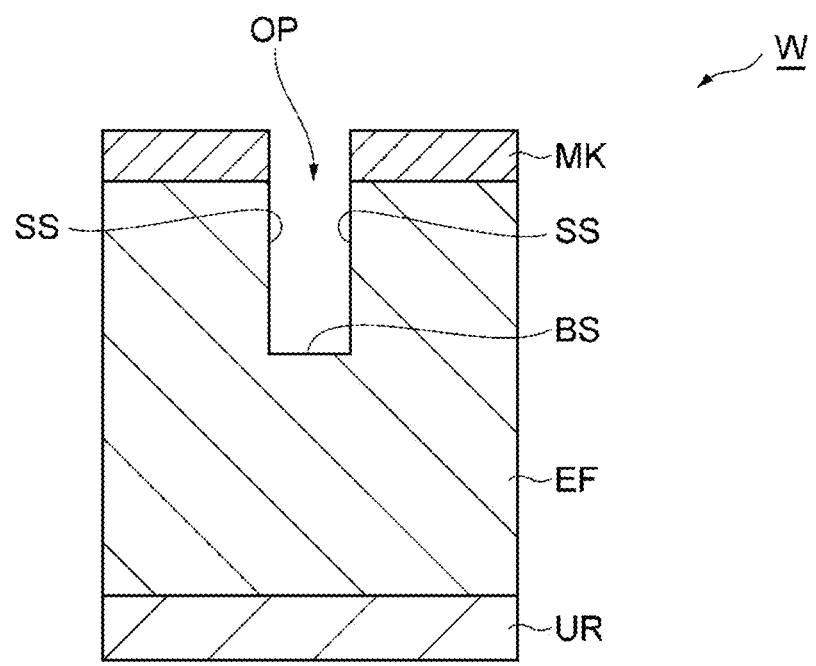
FIG. 5B is a partially enlarged cross-sectional view of the exemplary substrate after step STa.

FIG. 5A is a diagram illustrating an exemplary step STa included in the etching method shown in FIG. 1. FIG. 5B is a partially enlarged cross-sectional view of the exemplary substrate after step STa. In step STa, the layer EF is exposed to a chemical species in the plasma Pa to be etched with the chemical species as shown in FIG. 5A. In step STa, the layer EF is etched to a position between its lower and upper surfaces. The position is defined to allow etching of the layer EF to the position in step STa without causing substantially any lateral etching of the layer EF. The lower surface of the layer EF is an interface in contact with the underlying region UR. The upper surface of the layer EF is exposed through an opening in the mask MK. When step STa is performed, a recess OP, which is continuous with the opening in the mask MK, is formed in the layer EF as shown in FIG. 5B. The recess OP is defined by a side wall surface SS acid a bottom surface BS. The mask MK and the layer EF include the side wall surface SS. The layer EF includes the bottom surface BS. The mask MK can be thinner after step STa.

In step STa, the controller 80 controls the exhaust device 50 to maintain the chamber 10 at a specified gas pressure. In step STa, the controller 80 controls the controllable gas supply GS to supply the process gas into the chamber 10. In step STa, the controller 80 controls the plasma generator to generate plasma from the process gas. In step STa in one embodiment, the controller 80 controls at least one of the first RF power supply 62 or the second RF power supply 64 to provide at least one of the first RF power or the second RF power.

The method MT may eliminate step STa. In this case, the layer EF on the substrate to be processed with the method MT has the recess OP in advance. With the method MT with no step STa, the processing in steps ST1 and ST2 may be performed on the substrate W shown in FIG. 2.

In step ST1, a protective layer PL is formed on the side wall surface SS defining the recess OP in the substrate W. The protective layer PL contains phosphorus. The protective layer PL is formed from, for example, phosphorus, phosphoric acid, polyphosphoric acid, a phosphate, a phosphate ester, a phosphorus oxide, or a phosphorus nitride. The phosphate is, for example, calcium dihydrogen phosphate. The phosphorus oxide is, for example, tetraphosphorus decaoxide.

Figure 6:
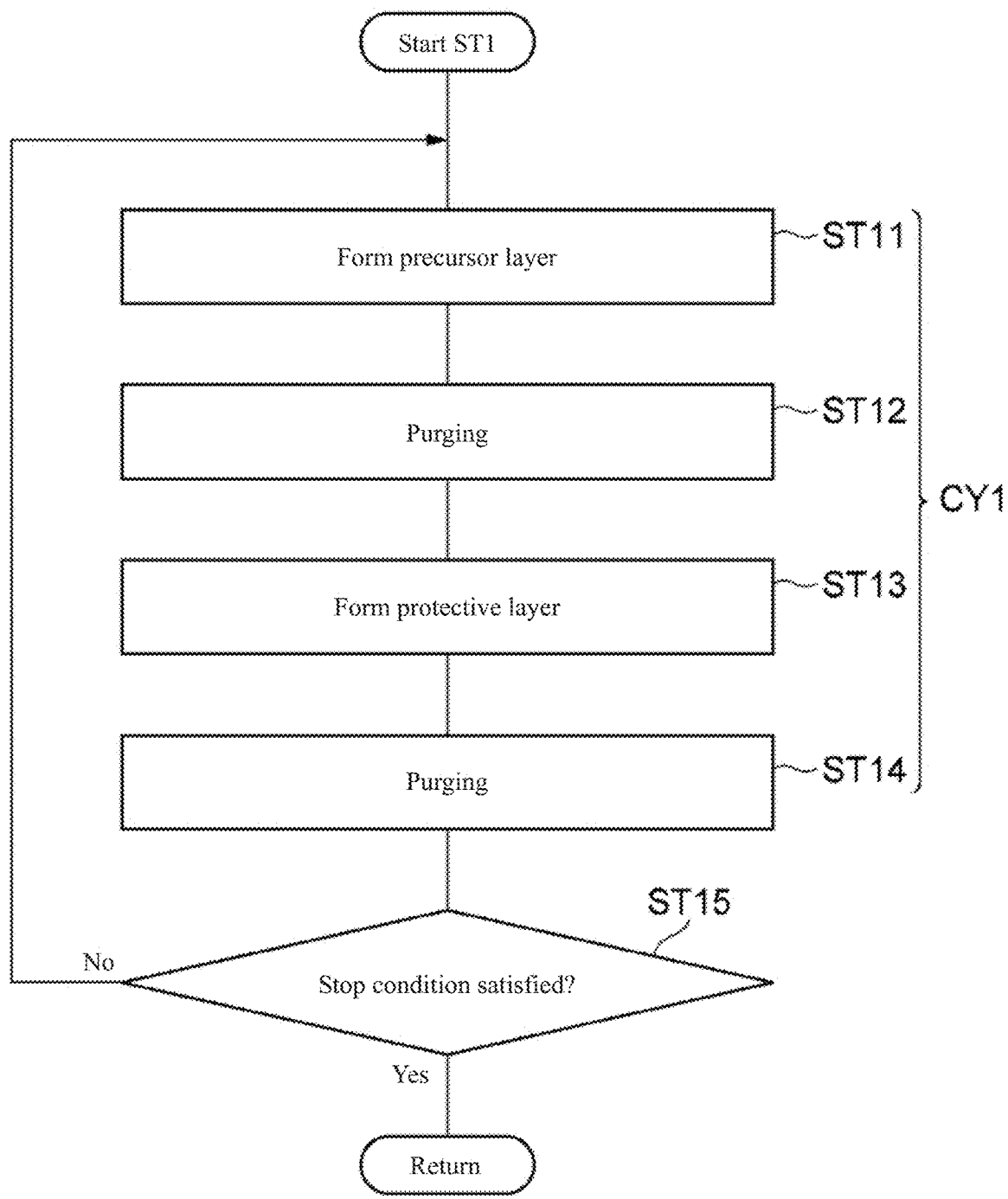
FIG. 6 is a flowchart of layer deposition that may be included in the etching method according to the exemplary embodiment.
Figure 7A:
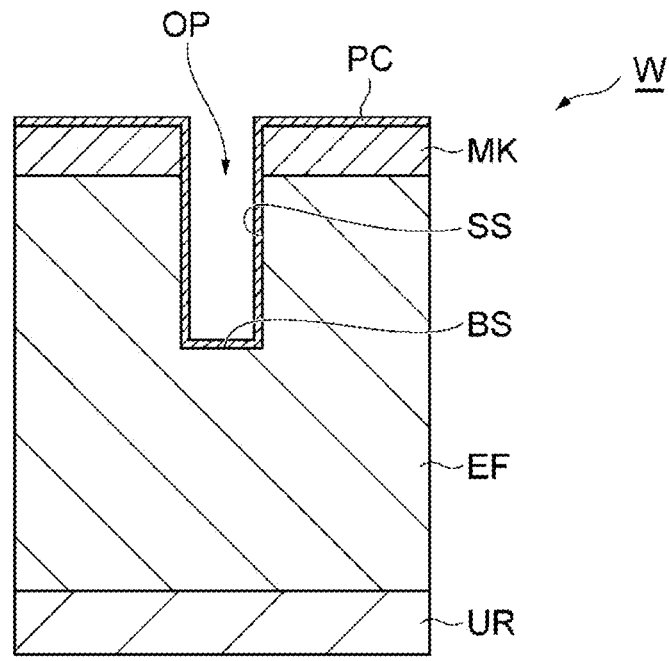
FIG. 7A is a partially enlarged cross-sectional view of the exemplary substrate after a precursor layer is formed.
Figure 7B:
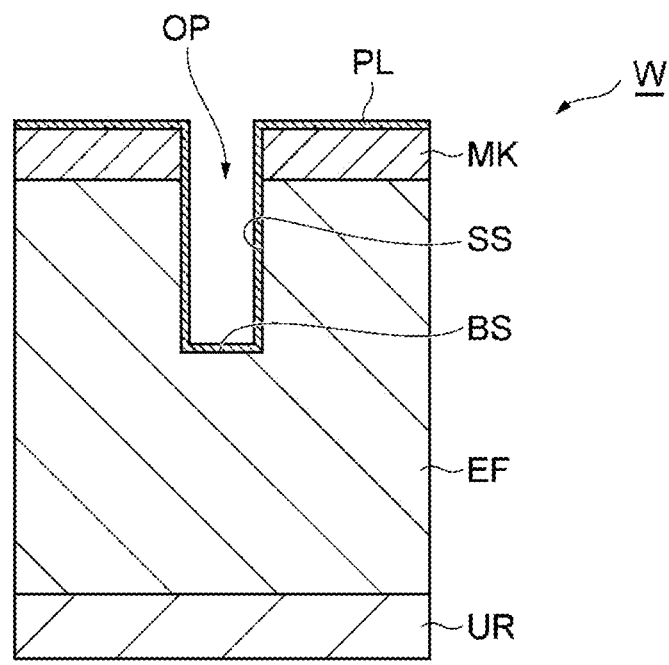
FIG. 7B is a partially enlarged cross-sectional view of the exemplary substrate after a protective layer is formed.

In one embodiment, step ST1 may include layer deposition shown in a flowchart of FIG. 6. FIG. 6 is a flowchart of layer deposition that may be included in the etching method according to the exemplary embodiment. FIGS. 7A and 7B will now be referred to in addition to FIG. 6. FIG. 7A is a partially enlarged cross-sectional view of the exemplary substrate after a precursor layer is formed. FIG. 7B is a partially enlarged cross-sectional view of the exemplary substrate after a protective layer is formed.

In one embodiment, step ST1 includes step ST11 and step ST13. Step ST1 may further include step ST12 and step ST14. Step ST12 is performed between step ST11 and step ST13. Step ST14 is performed between step ST13 and step ST11.

In step ST11, a precursor layer PC is formed on the surface of the substrate W including the side wall surface SS. In step ST11, the precursor layer PC is formed with a first gas. The first gas contains a substance for forming the precursor layer PC on the substrate W. The first gas or a second gas used in step ST13 contains phosphorus. The first gas may further contain a carrier gas, which is an inert gas such as a noble gas or a nitrogen gas. In step ST11, the precursor layer PC is formed on the substrate W with the substance contained in the first gas as shown in FIG. 7A. In step ST11, the precursor layer PC may be formed without involving plasma generation from the first gas. In some embodiments, the precursor layer PC may be formed with a chemical species in the plasma generated from the first gas in step ST11.

In step ST11, the controller 80 controls the controllable gas supply GS to supply the first gas into the chamber 10. In step ST11, the controller 80 controls the exhaust device 50 to maintain the chamber 10 at a specified gas pressure. When step ST11 involves plasma generation, the controller 80 controls the plasma generator to generate plasma from the first gas in the chamber 10. In one embodiment, the controller 80 controls at least one of the first RF power supply 62 or the second RF power supply 64 to provide at least one of the first RF power or the second RF power to generate plasma from the first gas.

In step ST12, the gas in the internal space 10s is purged. In step ST12, the controller 80 controls the exhaust device 50 to evacuate the internal space 10s. In step ST12, the controller 80 may control the controllable gas supply GS to supply an inert gas into the chamber 10. The processing in step ST12 may replace the first gas with the inert gas in the chamber 10. The processing in step ST12 may remove excessive substances adsorbed on the substrate W. The processing in steps ST11 and ST12 may form a monomolecular precursor layer PC on the substrate W.

In step ST13, the protective layer PL is formed from the precursor layer PC as shown in FIG. 7B. In step ST13, the second gas is used to form the protective layer PL. The second gas contains a reactive species that reacts with a substance contained in the precursor layer PC to form the protective layer PL from the precursor layer PC. The second gas may further contain a carrier gas, which is an inert gas such as a noble gas or a nitrogen gas. In step ST13, the protective layer PL may be formed without involving plasma generation from the second gas. In some embodiments, the protective layer PL may be formed with a chemical species in the plasma generated from the second gas in step ST13.

In step ST13, the controller 80 controls the controllable gas supply GS to supply the second gas into the chamber 10. In step ST13, the controller 80 controls the exhaust device 50 to maintain the chamber 10 at a specified gas pressure. When step ST13 involves plasma generation, the controller 80 controls the plasma generator to generate plasma from the second gas in the chamber 10. In one embodiment, the controller 80 controls at least one of the first RF power supply 62 or the second RF power supply 64 to provide at least one of the first RF power or the second RF power to generate plasma from the second gas.

In step ST14, the gas in the internal space 10s is purged. The processing in step ST14 is the same as the processing in step ST12. The processing in step ST14 may replace the second gas with the inert gas in the chamber 10.

In step ST1, multiple layer deposition cycles CY1 each including steps ST11 and ST13 may be repeated sequentially. The layer deposition cycles CY1 each may further include steps ST12 and ST14. The thickness of the protective layer PL may be adjusted by controlling the number of layer deposition cycles CY1 to be repeated. When the layer deposition cycle CY1 is repeated, the determination is performed as to whether a stop condition is satisfied in step ST15. The stop condition is satisfied when the count of layer deposition cycles CY1 performed reaches a predetermined number. When the stop condition is not satisfied in step ST15, the layer deposition cycle CY1 is restarted. When the stop condition is satisfied in step ST15, step ST1 ends and the processing advances to step ST2 as shown in FIG. 1.

In one embodiment, the first gas contains a phosphorus-containing substance, and the second gas contains $H_2O$, an inorganic compound with an N—H bond, a carbon-containing substance, a silicon-containing substance, or a phosphorus-containing substance. The phosphorus-containing substance contained in the first gas and the phosphorus-containing substance that may be contained in the second gas may be a phosphoryl compound, a phosphine substance, a phosphorane compound, a phosphaalkene compound, a phosphaalkyne compound, or a phosphazene compound. The phosphoryl compound is, for example, phosphorus oxychloride, trimethyl phosphate (($CH_3O)_3PO$), triethyl phosphate (($C_2H_5O)_3PO$), hexamethylphosphoric triamide (($N(CH_3)_2)_3PO$), or diphenylphosphoryl chloride. The phosphine substance is, for example, phosphine, phosphorus trifluoride, phosphorus trichloride, or phosphorus tribromide. The phosphine substance may be $P_x(C_yH_z)_n$, where x, y, z, and n are integers greater than or equal to 1. $P_x(C_yH_z)_n$ is, for example, trimethylphosphine. In some embodiments, the phosphine substance is trimethyl phosphite ($P(OCH_3)_3$), tris(dimethylamino)phosphine ($P(N(CH_3)_2)_3$), or tris(trimethylsilyl)phosphine ($P(Si(CH_3)_3)$. The phosphorane compound is, for example, phosphorus pentatfluoride or phosphorus pentachloride. The phosphaalkene compound is, for example, phosphaethene or phosphorine. The phosphaalkyne compound is, for example, phosphaethyne or adamantylphosphaethyne. The phosphazene compound is, for example, hexafluorocyclotriphosphazene or hexaphenoxycyclotriphosphazene. The inorganic compound with an N—H bond may be ammonia ($NH_3$), diazene ($N_2H_2$), hydrazine ($N_2H_4$), or an amine. The amine is, for example, dimethylamine or ethylenediamine. The carbon-containing substance may be a hydrocarbon, a fluorocarbon, an organic compound with a hydroxyl group, a carboxylic acid, a carboxylic anhydride, or a carboxylic halide. The hydrocarbon is, for example, methane or propylene. The fluorocarbon is, for example, $CF_4$ or $C_4F_6$. The organic compound with a hydroxyl group is, for example, alcohols such as methanol or ethylene glycol, or phenols. The carboxylic acid is, for example, acetic acid or oxalic acid. The silicon-containing substance is, for example, silicon chloride or aminosilane. The phosphorus-containing substance contained in the first gas and the phosphorus-containing substance that may be contained in the second gas may be the same or different from each other. When the first gas and the second gas contain the same phosphorus-containing substance, plasma formed from either the first gas or the second gas is used.

When the first gas contains a phosphorus-containing substance and the second gas contains $H_2O$, the protective layer PL is formed from phosphoric acid. When the first gas contains a phosphorus-containing substance and the second gas contains an organic compound with a hydroxyl group, a carboxylic acid, a carboxylic anhydride, or a carboxylic halide, the protective layer PL is formed from a phosphate ester. When the first gas contains a phosphorus-containing substance and the second gas contains an inorganic compound with an N—H bond, the protective layer PL is formed from a phosphorus nitride or a phosphoric triamide. When the first gas contains a phosphorus-containing substance and the second gas contains a phosphorus-containing substance, the protective layer PL is formed from phosphoric acid, a phosphorus oxide, or a phosphorus nitride. When the first gas contains a phosphorus-containing substance and the second gas contains a carbon-containing substance such as a hydrocarbon or a fluorocarbon, the protective layer PL is formed from a phosphorus-doped carbon-containing material. When the first gas contains a phosphorus-containing substance and the second gas contains a silicon-containing substance, the protective layer PL is formed from a phosphorus-doped silicon-containing material.

In another embodiment, the first gas contains the carbon-containing substance listed above or the silicon-containing substance listed above and the second gas contains the phosphorus-containing substance listed above. When the first gas contains a carbon-containing substance such as a hydrocarbon or a fluorocarbon and the second gas contains a phosphorus-containing substance, the protective layer PL is formed from a phosphorus-doped carbon-containing material. When the first gas contains a silicon-containing substance and the second gas contains a phosphorus-containing substance, the protective layer PL is formed from a phosphorus-doped silicon-containing material.

In still another embodiment, the first gas contains the phosphorus-containing substance listed above, and the second gas contains at least one of $H_2$, $O_2$, or $N_2$. In this embodiment, the protective layer PL is formed from the precursor layer PC receiving a chemical species in the plasma generated from the second gas. When the first gas contains a phosphorus-containing substance and the second gas contains $H_2$ and $O_2$, the protective layer PL is formed from phosphoric acid. When the first gas contains a phosphorus-containing substance and the second gas contains $N_2$ and $H_2$, the protective layer PL is formed from a phosphorus nitride. When the first gas contains a phosphorus-containing substance and the second gas contains $H_2$, the protective layer PL is formed from phosphorus.

Step ST2 follows step ST1 in which the protective layer PL is formed on the side wall surface SS. The method MT may further include, before step ST2, a step (breakthrough process) for generating plasma from, for example, a $CF_4$ gas to etch the protective layer PL on the bottom surface BS. Step ST2 includes etching the layer EF. In one embodiment, the layer EF is etched with a chemical species in the plasma. In step ST2, plasma P2 is generated from a process gas in the chamber 10. To process the first exemplary substrate W described above including the organic layer serving as the layer EF on the substrate W, a process gas containing an oxygen-containing gas may be used in step ST2. The oxygen-containing gas includes an oxygen gas, a carbon monoxide gas, or a carbon dioxide gas. In some embodiments, the process gas used in step ST2 for processing the first exemplary substrate W may contain at least one of a nitrogen gas or a hydrogen gas.

To process the second exemplary substrate W described above including the low-di electric-constant layer serving as the layer EF on the substrate W, a process gas containing a fluorine-containing gas may be used in step ST2. The fluorine-containing gas includes a fluorocarbon gas. The fluorocarbon gas includes a $C_4F_8$ gas.

To process the third exemplary substrate W described above including the polycrystalline silicon layer serving as the layer EF on the substrate W, a process gas containing a halogen-containing gas may be used in step ST2. The halogen-containing gas includes a HBr gas, a $Cl_2$ gas, or a $SF_6$ gas.

To process the fourth exemplary substrate W described above including the silicon oxide layer serving as the layer EF, a process gas containing a fluorocarbon gas may be used in step ST2. To process the fourth exemplary substrate W including the silicon nitride layer serving as the layer EF, a process gas containing a hydrofluorocarbon gas may be used in step ST2. To process the fourth exemplary substrate W including the multilayer including the alternate stack of silicon oxide layers and silicon nitride layers serving as the layer EF, a process gas containing a fluorocarbon gas and a hydrofluorocarbon gas may be used in step ST2. To process the fourth exemplary substrate W including the multilayer including the alternate stack of silicon oxide layers and polysilicon layers serving as the layer EF, a process gas containing a fluorocarbon gas and a halogen-containing gas may be used in step ST2. The fluorocarbon gas includes a $CF_4$ gas, a $C_4F_6$ gas, or a $C_4F_8$ gas. The hydrofluorocarbon gas includes a $CH_3F$ gas. The halogen-containing gas includes HBr gas or a $Cl_2$ gas.

Figure 8A:
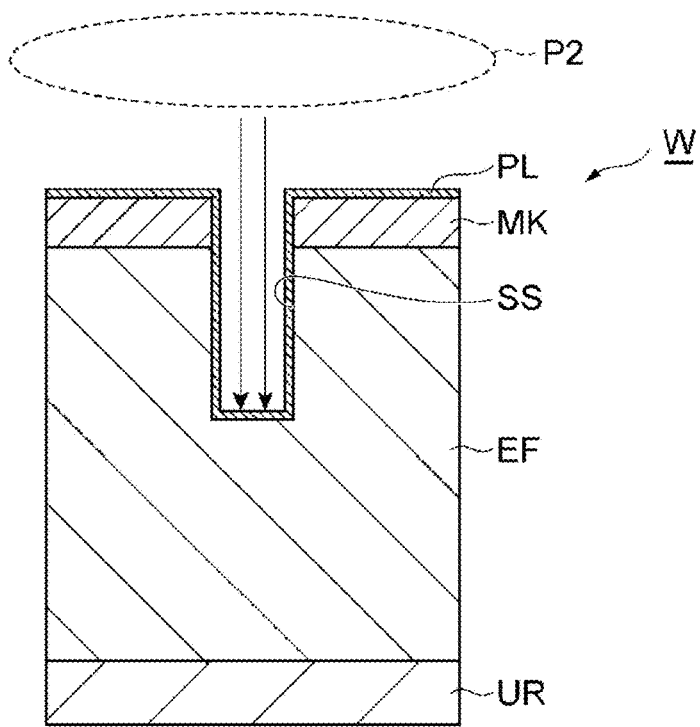
FIG. 8A is a diagram illustrating an example step ST2 included in the etching method shown in FIG. 1.
Figure 8B:
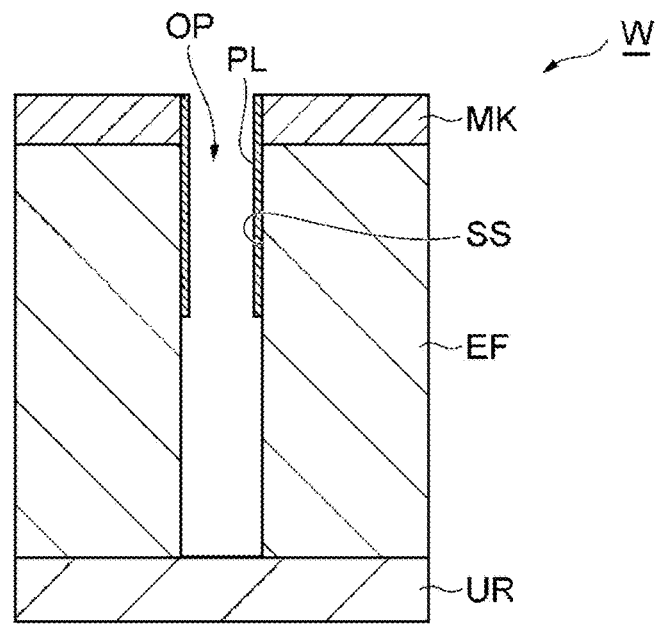
FIG. 8B is a partially enlarged cross-sectional view of the exemplary substrate after step ST2.

FIG. 8A is a diagram illustrating an example step ST2 included in the etching method shown in FIG. 1. FIG. 8B is a partially enlarged cross-sectional view of the exemplary substrate after step ST2. In step ST2, the layer EF is exposed to a chemical species in the plasma P2 to be etched with the chemical species as shown in FIG. 8A. The processing in step ST2 increases the depth of the recess OP as shown in FIG. SB.

In step ST2, the controller 80 controls the exhaust device 50 to maintain the chamber 10 at a specified gas pressure. In step ST2, the controller 80 controls the controllable gas supply GS to supply the process gas into the chamber 10. In step ST2, the controller 80 controls the plasma generator to generate plasma from the process gas. In step ST2 in one embodiment, the controller 80 controls at least one of the first RF power supply 62 or the second RF power supply 64 to provide at least one of the first RF power or the second RF power.

With the method MT, multiple cycles CY each including steps ST1 and ST2 may be performed sequentially. When the cycles CY are performed sequentially, the determination is performed as to whether a stop condition is satisfied in step ST3. The stop condition is satisfied when the count of the cycles CY performed reaches a predetermined number. When the stop condition is not satisfied in step ST3, the cycle CY is restarted. When the stop condition is satisfied in step ST3, the method MT ends.

With the method MT, the substrate W has the side wall surface SS being protected by the protective layer PL when the layer EF on the substrate W is etched. The protective layer PL contains phosphorus and is highly resistant to a chemical species used for etching the layer EF. The method MT thus enables etching of the layer EF on the substrate W with reduced etching of the side wall surface SS.

The condition for step ST1 for forming the protective layer PL in at least one of the multiple cycles CY may differ from the condition for step ST1 for forming the protective layer PL in at least another one of the multiple cycles CY. The conditions for step ST1 may differ in each cycle CY. In this case, a protective layer PL may be formed in each cycle to have a thickness or coverage different from the thickness or coverage of a protective layer PL formed in other cycles.

The condition for step ST2 for etching the layer EF in at least one of the multiple cycles CY may differ from the condition for step ST2 for etching the layer EF in at least another one of the multiple cycles CY. The conditions for step ST2 may differ in each cycle CY. In this case, the layer EF etched in each cycle has an etched amount different from the etched amount of the layer EF in other cycles.

In each of the multiple cycles CY the condition for forming the protective layer PL in at least one layer deposition cycle of the multiple layer deposition cycles CY1 may differ from the condition for forming the protective layer PL in at least another one of the multiple layer deposition cycles CY1. More specifically, in each of the multiple cycles CY, the condition for at least step ST11 or step ST13 in one layer deposition cycle may differ from the condition for at least step ST11 or step ST13 in at least another layer deposition cycle. In each of the multiple cycles CY, the conditions for forming the protective layer PL may differ in each of the layer deposition cycles CY1. In this case, the thickness distributions of the protective layers PL formed in the multiple layer deposition cycles CY1 included in the multiple cycles CY may be controlled.

Figure 9A:
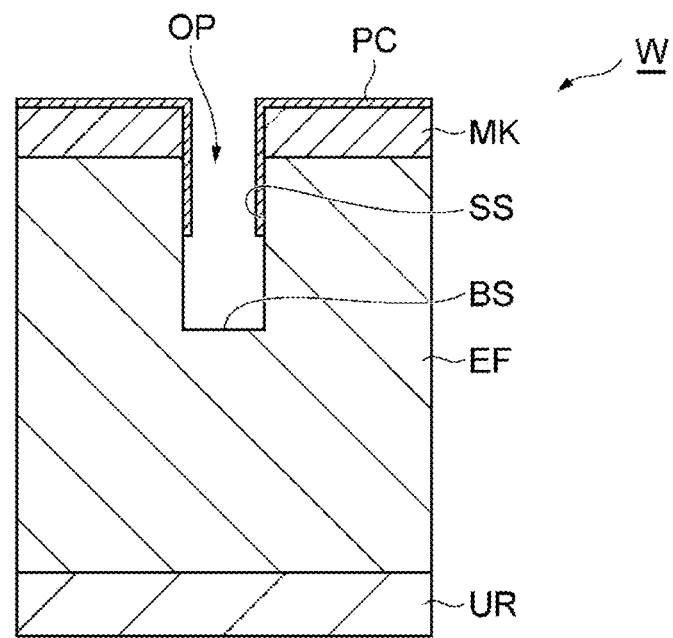
FIG. 9A is a partially enlarged cross-sectional view of an exemplary substrate after a precursor layer is formed.
Figure 9B:
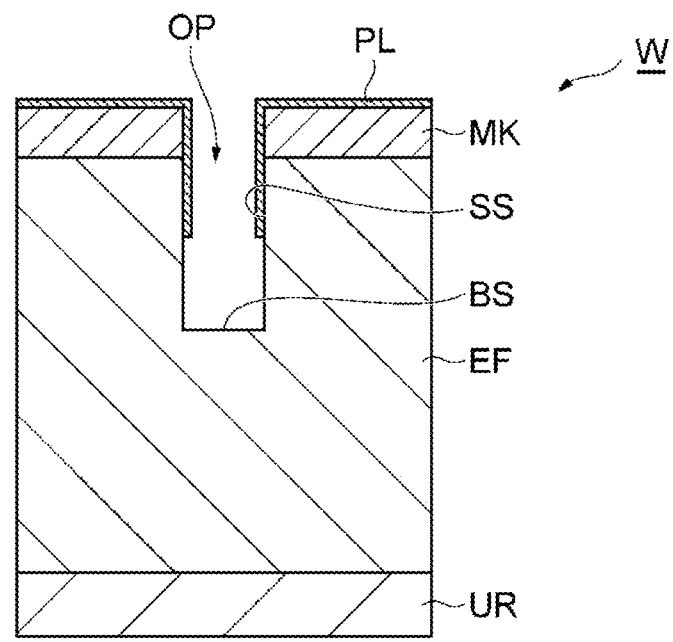
FIG. 9B is a partially enlarged cross-sectional view of the exemplary substrate after a protective layer is formed.

FIG. 9A is a partially enlarged cross-sectional view of an exemplary substrate after a precursor layer is formed. FIG. 9B is a partially enlarged cross-sectional view of the exemplary substrate after a protective layer is formed. As shown in FIG. 9B, the protective layer PL, may cover a part of the side wall surface SS that can otherwise undergo lateral etching, rather than covering the entire surface of the substrate W. For example, the protective layer PL may not cover the bottom surface BS. In some embodiments, the protective layer PL may have the thickness distribution varying depending on position. For example, the protective layer PL may have a thickness larger at positions near the upper end of the recess OP and smaller or no thickness at positions near a deeper portion of the recess OP. The protective layer PL with such a thickness distribution may be formed through layer deposition of the protective layer PL (described later with reference to FIGS. 9A and 9B) or through chemical vapor deposition (CND).

To form the protective layer PL shown in FIG. 9B, the precursor layer PC may be formed in step ST11 to cover a part of the side wall surface SS, rather than the entire surface of the substrate W, as shown in FIG. 9A. To form the precursor layer PC in this manner, at least one of the first to fifth conditions below is satisfied in step ST11. Under a first condition, the gas pressure in the chamber 10 is set to a lower pressure than the pressure at which the substance forming the precursor layer PC is adsorbed on the entire surface of the substrate W during step ST11 when the other processing conditions are the same. Under a second condition, the processing duration for step ST11 is set to a shorter duration than the processing duration for which the substance forming the precursor layer PC is adsorbed on the entire surface of the substrate W when the other processing conditions are the same. Under a third condition, the dilution ratio of the first gas containing the substance forming the precursor layer PC is se to a higher ratio than the dilution ratio at which the substance forming the precursor layer PC is adsorbed on the entire surface of the substrate W when the other processing conditions are the same. Under a fourth condition, the temperature of the substrate support 14 is set to a lower temperature than the temperature at which the substance forming the precursor layer PC is adsorbed on the entire surface of the substrate W during step ST11 when the other processing conditions are the same. A fifth condition may be used when step ST11 involves plasma generation.

Under the fifth condition, the absolute value of RF power (at least one of first RF power or second RF power) is set to a lower value than the absolute value at which the substance forming the precursor layer PC is adsorbed on the entire surface of the substrate W when the other processing conditions are the same.

To form the protective layer PL shown in FIG. 9B, at least one of the first to fifth conditions below may be satisfied in step ST13. Under a first condition, the gas pressure in the chamber 10 is set to a lower pressure than the pressure at which a reaction of the substance contained in the second gas with the substance forming the precursor layer PC completes across the entire precursor layer PC during step ST13 when the other processing conditions are the same. Under a second condition, the processing duration for step ST13 is set to a shorter duration than the processing duration for which a reaction of the substance contained in the second gas with the substance forming the precursor layer PC completes across the entire precursor layer PC when the other processing conditions are the same. Under a third condition, the dilution ratio of the second gas containing the substance forming the protective layer PL is set to a higher ratio than the dilution ratio at which a reaction of the substance contained in the second gas with the substance forming the precursor layer PC completes across the entire precursor layer PC when the other processing conditions are the same. Under a fourth condition, the temperature of the substrate support 14 is set to a lower temperature than the temperature at which a reaction of the substance contained in the second gas with the substance forming the precursor layer PC completes across the entire precursor layer PC during step ST13 when the other processing conditions are the same. A fifth condition may be used when step ST13 involves plasma generation. Under the fifth condition, the absolute value of RF power (at least one of first RF power or second RF power) is set to a lower value than the absolute value at which a reaction of the substance contained in the second gas with the substance forming the precursor layer PC completes across the entire precursor layer PC when the other processing conditions are the same.

In another embodiment, CVD may be used for layer deposition in step ST1 included in the method MT. In step ST1, CVD may be plasma CVD or thermal CVD. When CVD is used for the layer deposition in step ST1, a layer deposition gas containing the phosphorus-containing substance listed above for the first gas and the second gas is supplied into the chamber 10. The layer deposition gas may further contain the carbon-containing substance or the silicon-containing substance listed above for the first gas and the second gas. The layer deposition gas may include at least one of a noble gas (e.g., a He gas, an Ar gas, a Ne gas, or a Xe gas), $H_2$, $O_2$, $H_2O$, $N_2$, ammonia, diazene, or hydrazine.

When a layer deposition gas containing a phosphorus-containing substance such as the phosphoryl compound listed above is used in step ST1 using CVD, the protective layer PL is formed from phosphoric acid or a phosphorus oxide. When a layer deposition gas containing the phosphorus-containing substance and the carbon-containing substance listed above is used, the protective layer PL is formed from a phosphorus-doped carbon-containing material. When a layer deposition gas containing the phosphorus-containing substance and the silicon-containing substance listed above is used in step ST1 using CVD, the protective layer PL is formed from a phosphorus-doped silicon-containing material. When a layer deposition gas containing, in addition to the phosphorus-containing substance listed above, at least one of $H_2$ or a noble gas is used in step ST1 using CVD, the protective layer PL is formed from phosphorus. When a layer deposition gas containing, in addition to the phosphorus-containing substance listed above, at least one of $O_2$ or $H_2O$ is used in step ST1 using CVD, the protective layer PL is formed from phosphoric acid or a phosphorus oxide. When a layer deposition gas containing, in addition to the phosphorus-containing substance listed above, a nitrogen-containing substance such as $N_2$, ammonia, diazene, or hydrazine is used in step ST1 using CVD, the protective layer PL is formed from a phosphorus nitride.

Figure 10:
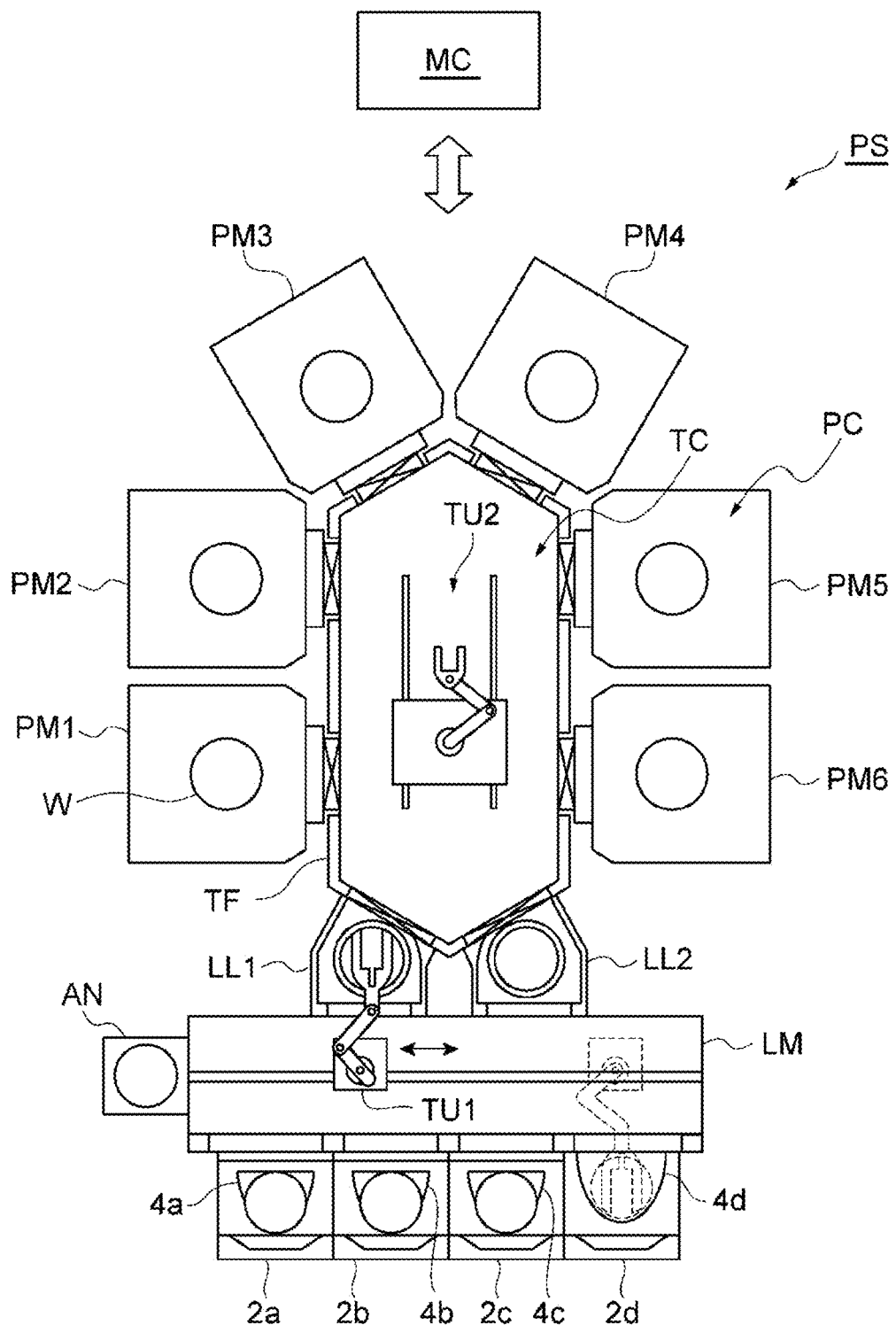
FIG. 10 is a diagram of a substrate processing system according to an exemplary embodiment.

Referring now to FIG. 10, the method MT may be implemented by a substrate processing system including a layer deposition apparatus and a plasma processing apparatus. FIG. 10 is a diagram of a substrate processing system according to an exemplary embodiment. The method MT may be implemented by a substrate processing system PS shown in FIG. 10.

The substrate processing system PS includes tables 2a to 2d, containers 4a to 4d, a loader module LM, an aligner AN, loadlock modules LL1 and LL2, process modules PM1 to PM6, a transfer module TF, and a controller MC. The substrate processing system PS may include one or more tables, containers, and loadlock modules. The substrate processing system PS may include two or more process modules.

The tables 2a to 2d are arranged along one edge of the loader module LM. The containers 4a to 4d are mounted on the respective tables 2a to 2d. The containers 4a to 4d each are, for example, a container called a front-opening unified pod (FOUP). The containers 4a to 4d store substrates W.

The loader module LM includes a chamber. The chamber in the loader module LM has an atmospheric pressure. The loader module LM includes a transfer unit which may be an articulated robot controlled by the controller MC. The transfer unit TU1 transfers a substrate W through the chamber in the loader module LM. The transfer unit TU1 may transfer the substrate W between the containers 4a to 4d and the aligner AN, between the aligner AN and the loadlock modules LL1 and LL2, and between the loadlock modules LL1 and LL2 and the containers 4a to 4d. The aligner AN is connected to the loader module LM to adjust (correct) the position of the substrate W.

The loadlock modules LL1 and LL2 are located between the loader module LM and the transfer module TF. The loadlock modules LL1 and LL2 each serve as a preliminary decompression chamber.

The transfer module TF is connected to the loadlock modules LL1 and LL2 via corresponding gate valves. The transfer module TF includes a decompressible transfer chamber TC. The transfer module TF includes a transfer unit TU2, which may be an articulated robot controlled by the controller MC. The transfer unit TU2 transfers the substrate W through the transfer chamber TC. The transfer unit TU2 may transfer the substrate W between the loadlock modules LL1 and LL2 and the process modules PM1 to PM6, and between any two of the process modules PM1 to PM6.

The process modules PM1 to PM6 are processing apparatuses dedicated to intended substrate processing. One of the process modules PM1 to PM6 is a layer deposition apparatus used to form the protective layer PL in step ST1. The layer deposition apparatus is a plasma processing apparatus such as the plasma processing apparatus 1 or another plasma processing apparatus when step ST1 involves plasma generation. The layer deposition apparatus may eliminate a plasma generator when the protective layer PL is formed without involving plasma generation in step ST1.

Another one of the process modules PM1 to PM6 is a substrate processing apparatus such as the plasma processing apparatus 1 or another plasma processing apparatus. The substrate processing apparatus is used for etching the layer EF in step ST2. The substrate processing apparatus may be used to perform etching in step STa. In some embodiments, still another one of the process modules PM1 to PM6 serves as a substrate processing apparatus and may be used to perform etching in step STa.

In the substrate processing system PS, the controller MC controls the components of the substrate processing system PS. The controller MC controls the layer deposition apparatus to form the protective layer PL in step ST1. After the protective layer PL is formed, the controller MC controls the substrate processing apparatus to etch the layer EF to increase the depth of the recess OP. The substrate processing system PS can transfer the substrate W between the process modules without exposing the substrate W to the atmosphere.

Figure 11:
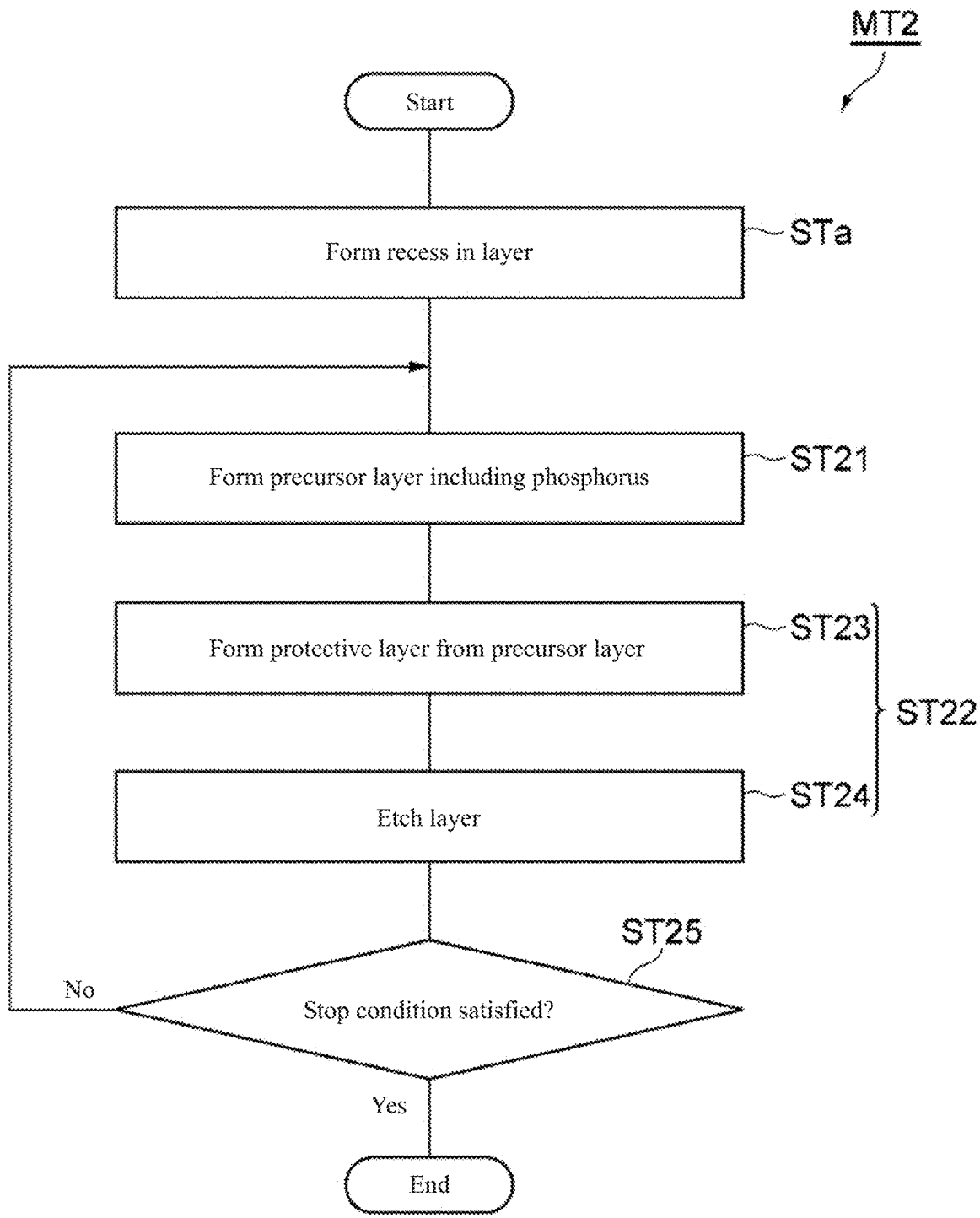
FIG. 11 is a flowchart of an etching method according to another exemplary embodiment.

FIG. 11 is a flowchart of an etching method according to another exemplary embodiment. The etching method shown in FIG. 11 (hereinafter referred to as the method MT2) is used for etching a layer on a substrate. The method MT2 may be used for the substrate W shown in FIG. 2. The method MT2 used by the plasma processing apparatus 1 to process the substrate W shown in FIG. 2 will be described by way of example. The method MT2 may be used by another substrate processing apparatus. The method MT2 may be used to process another substrate.

The method MT2 is implemented with the substrate W placed on the substrate support 14. The method MT2 may start from step STa. The processing in step STa included in the method MT2 is the same as the processing in step STa included in the method MT. The method MT2 may eliminate step STa. In this case, the layer EF on the substrate to be processed with the method MT2 has the recess OP in advance. With the method MT2 with no step STa, the processing in steps ST21 and ST22 included in the method MT2 may be performed on the substrate W shown in FIG. 2.

In step ST21, a precursor layer PC is formed on the surface of the substrate W. The precursor layer PC contains phosphorus. In step ST21, the precursor layer PC is formed with a layer deposition gas. The layer deposition gas used in step ST21 contains a substance for forming the precursor layer PC on the substrate W. The layer deposition gas used in step ST21 contains a phosphorus-containing substance. The phosphorus-containing substance may be the phosphorus-containing substance listed above for the method MT. The layer deposition gas used in step ST21 may further contain a carrier gas, which is an inert gas such as a noble gas or a nitrogen gas. In step ST21, the precursor layer PC is formed on the substrate W with the substance contained in the layer deposition gas as shown in FIG. 7A, In step ST21, the precursor layer PC may be formed without plasma generation from the layer deposition gas. In some embodiments, the precursor layer PC may be formed with a chemical species in the plasma generated from the layer deposition gas in step ST21.

In step ST21, the controller 80 controls the controllable gas supply GS to supply the layer deposition gas into the chamber 10. In step ST21, the controller 80 controls the exhaust device 50 to maintain the chamber 10 at a specified gas pressure. When step ST21 includes plasma generation, the controller 80 controls the plasma generator to generate plasma from the layer deposition gas in the chamber 10. In one embodiment, the controller 80 controls at least one of the first RF power supply 62 or the second RF power supply 64 to provide at least one of the first RF power or the second RF power to generate plasma from the layer deposition gas.

Step ST22 follows step ST21. In step ST22, the substrate W is processed with plasma from a process gas. Step ST22 includes steps ST23 and ST24. In step ST23, the protective layer PL is formed from the precursor layer PC with a chemical species in the plasma from the process gas. Step ST24 is performed during step ST23. In other words, steps ST23 and ST24 are performed at the same time. In step ST24, the layer EF on the substrate W is etched with a chemical species in plasma from the process gas. The chemical species in the plasma for converting the precursor layer PC into the protective layer PL and the chemical species in the plasma for etching the layer EF may be the same or different from each other. As shown in FIG. 8B, the processing in step ST22 forms the protective layer PL from the precursor layer PC, while at the same time etching the layer EF to increase the depth of the recess OP.

To process the first exemplary substrate W described above including the organic layer serving as the layer EF on the substrate W, a process gas containing an oxygen-containing gas may be used in step ST22 (more specifically, steps ST23 and ST24). The oxygen-containing gas includes an oxygen ($O_2$) gas, a carbon monoxide (CO) gas, or a carbon dioxide ($CO_2$) gas. In this case, the process gas may further contain carbonyl sulfide. To process the first exemplary substrate W, a process gas containing at least one of $O_2$, $CO_2$, $N_2$, $H_2$, $H_2O$, or an inorganic compound with an N—H bond may be used in step ST22. The inorganic compound with an N—H bond includes $NH_3$ or $N_2H_2$. When the first exemplary substrate W is processed, the protective layer PL is formed from the precursor layer PC with a chemical species in plasma generated from the process gas. In addition, the layer EF is etched with a chemical species in plasma generated from the process gas.

To process the second exemplary substrate W described above including the low-dielectric-constant layer serving as the layer EF on the substrate W, a process gas containing fluorine and nitrogen is used in step ST22. The process gas contains, for example, a fluorocarbon gas and a nitrogen-containing gas. The fluorocarbon gas includes a $C_4F_8$ gas. The nitrogen-containing gas includes a nitrogen ($N_2$) gas. In this case, the process gas may further contain at least one of a noble gas (e.g., Ar gas) or an oxygen-containing gas. The oxygen-containing gas includes an oxygen ($O_2$) gas or a carbon dioxide ($CO_2$) gas. In this case, the protective layer PL is formed from the precursor layer PC with at least one of nitrogen chemical species or oxygen chemical species in plasma generated from the process gas. In addition, the layer EF is etched with fluorine chemical species in plasma generated from the process gas.

To process the third exemplary substrate W described above including the polycrystalline silicon layer serving as the layer EF on the substrate W, a process gas containing at least one of a halogen-containing gas or an oxygen-containing gas may be used in step ST22. The halogen-containing gas includes a HBr gas, a $Cl_2$ gas, or a $SF_6$ gas. The oxygen-containing gas includes an oxygen gas, a carbon monoxide gas, or a carbon dioxide gas. In this case, the process gas may further contain a noble gas (e.g., Ar gas). In this case, the protective layer PL is formed from the precursor layer PC with oxygen chemical species in plasma generated from the process gas. In addition, the layer EF is etched with halogen chemical species in plasma generated from the process gas.

To process the fourth exemplary substrate W described above including the silicon oxide layer serving as the layer EF, a process gas containing a fluorocarbon gas is used in step ST22. In this case, the process gas further contains at least one of an oxygen-containing gas or a nitrogen-containing gas. The fluorocarbon gas includes a $CF_4$ gas, a $C_4F_6$ gas, or a $C_4F_8$ gas. The oxygen-containing gas includes an oxygen ($O_2$) gas, a carbon monoxide (CO) gas, or a carbon dioxide ($CO_2$) gas. The nitrogen-containing gas includes a nitrogen ($N_2$) gas. In this case, the process gas may further contain a noble gas (e.g., Ar gas). In this case, the protective layer PL is formed from the precursor layer PC with at least one of oxygen chemical species or nitrogen chemical species in plasma generated from the process gas. In addition, the layer EF is etched with fluorine chemical species in plasma generated from the process gas.

To process the fourth exemplary substrate W including the silicon nitride layer serving as the layer EF, a process gas containing at least one of a hydrofluorocarbon gas or an oxygen-containing gas is used in step ST22. The hydrofluorocarbon gas includes a $CH_3F$ gas. The oxygen-containing gas includes an oxygen ($O_2$) gas, a carbon monoxide (CO) gas, or a carbon dioxide ($CO_2$) gas. In this case, the process gas may further contain a noble gas (e.g., Ar gas). In this case, the protective layer PL is formed from the precursor layer PC with oxygen chemical species in plasma generated from the process gas. In addition, the layer EF is etched with fluorine chemical species in plasma generated from the process gas.

To process the fourth exemplary substrate W including the multilayer including the alternate stack of silicon oxide layers and silicon nitride layers serving as the layer EF, a process gas containing a fluorocarbon gas and a hydrofluorocarbon gas is used in step ST22. In this case, the process gas further contains at least one of an oxygen-containing gas or a nitrogen-containing gas. In this case, the process gas may further contain a noble gas (e.g., Ar gas). In this case, the protective layer PL is formed from the precursor layer PC with oxygen chemical species or nitrogen chemical species in plasma generated from the process gas. In addition, the layer EF is etched with fluorine chemical species in plasma generated from the process gas.

To process the fourth exemplary substrate W including the multilayer including the alternate stack of silicon oxide layers and polysilicon layers serving as the layer EF, a process gas containing a fluorocarbon gas and a halogen-containing gas may be used in step ST22. The fluorocarbon gas includes a $CF_4$ gas, a $C_4F_6$ gas, or a $C_4F_8$ gas. The halogen-containing gas includes a HBr gas or a $Cl_2$ gas. In this case, the process gas further contains at least one of an oxygen-containing gas or a nitrogen-containing gas. In this case, the process gas may further contain a noble gas (e.g., r gas). In this case, the protective layer PL is formed from the precursor layer PC with oxygen chemical species or nitrogen chemical species in plasma generated from the process gas. In addition, the layer EF is etched with fluorine chemical species and halogen chemical species in plasma generated from the process gas.

In step ST22, the controller 80 controls the exhaust device 50 to maintain the chamber 10 at a specified gas pressure. In step ST22, the controller 80 controls the controllable gas supply GS to supply the process gas into the chamber 10. In step ST22, the controller 80 controls the plasma generator to generate plasma from the process gas. In step ST22, the controller 80 controls at least one of the first RF power supply 62 or the second RF power supply 64 to provide at least one of the first RF power or the second RF power.

With the method MT2, multiple cycles each including steps ST21 and ST22 may be performed sequentially. When the cycles are performed sequentially, the determination is performed as to whether a stop condition is satisfied in step ST25. The stop condition is satisfied when the count of the cycles performed reaches a predetermined number. When the stop condition is not satisfied in step ST25, the cycle is restarted. When the stop condition is satisfied in step ST25, the method MT2 ends.

The method MT2 may be implemented by the substrate processing system PS. In this case, the processing in step ST21 is performed with one of the process modules PM1 to PM6 being a layer deposition apparatus. The processing in step ST22 (more specifically, steps ST23 and ST24) is performed with another one of the process modules PM1 to PM6 being the plasma processing apparatus 1 or another plasma processing apparatus.

With the method MT2, steps ST23 and ST24 are performed at the same time. More specifically, a chemical species for converting the precursor layer PC into the protective layer PL and a chemical species for etching the layer EF are generated at the same time. The method MT2 thus has a higher throughput.

Although the exemplary embodiments have been described above, the embodiments are not restrictive, and various additions, omissions, substitutions, and changes may be made. The components in the different exemplary embodiments may be combined to form another exemplary embodiment.

The substrate processing apparatus implementing the methods MT and MT2 may include any type of plasma processing apparatus. The substrate processing apparatus implementing the methods MT and MT2 may be, for example, a capacitively coupled plasma processing apparatus other than the plasma processing apparatus 1. The substrate processing apparatus implementing the methods MT and MT2 may be an inductively coupled plasma processing apparatus, an electron cyclotron resonance (ECR) plasma processing apparatus, or a plasma processing apparatus that generates plasma using surface waves such as microwaves. When the method MT uses no plasma, the substrate processing apparatus may eliminate the plasma generator.

The layer EF may be formed from metal, metal oxide, or chalcogenide. The layer EF may be etched with plasma generated from a process gas containing, for example, a halogen-containing gas in steps STa, ST2, and ST24.

Figure 12:
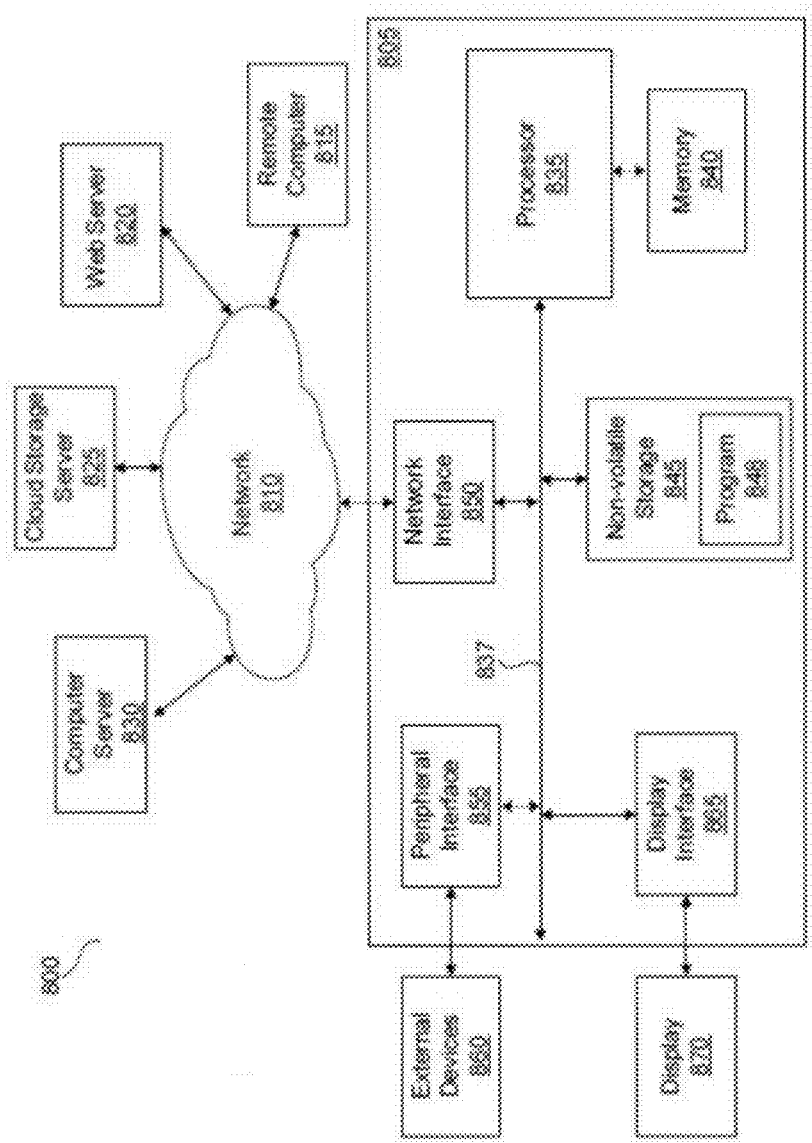
FIG. 12 is a diagram of controller circuitry used to control process operations, such as the substrate processing apparatus of FIG. 3 and other processes and equipment described herein.

FIG. 12 is a block diagram of processing circuitry for performing computer-based operations described herein. FIG. 12 illustrates processing circuitry 805 that may be used to control any computer-based control processes, descriptions or blocks in flowcharts can be understood as representing modules, segments or portions of code which include one or more executable instructions for implementing specific logical functions or steps in the process, and alternate implementations are included within the scope of the exemplary embodiments of the present advancements in which functions can be executed out of order from that shown or discussed, including substantially concurrently or in reverse order, depending upon the functionality involved, as would be understood by those skilled in the art. The various elements, features, and processes described herein may be used independently of one another or may be combined in various ways. All possible combinations and sub-combinations are intended to fall within the scope of this disclosure.

In FIG. 12, the processing circuitry 805 includes a processor (CPU) 835 which performs one or more of the control processes described above; below. The process data and instructions may be stored in memory 840. These processes and instructions (e.g., program 848) may also be stored on a storage medium disk 845 such as a hard drive (HDD) or portable storage medium or may be stored remotely. Further, the claimed advancements are not limited by the form of the computer-readable media on which the instructions of the inventive process are stored. For example, the instructions may be stored on CDs, DVDs, in FLASH memory, RAM, ROM, PROM, EPROM, EEPROM, hard disk or any other information processing device with which the processing circuitry 805 communicates, such as a server or computer.

Further, the claimed advancements may be provided as a utility application, background daemon, or component of an operating system, or combination thereof, executing in conjunction with CPU 835 and an operating system such as Microsoft Windows, UNIX, Solaris, LINUX, Apple MAC-OS and other systems known to those skilled in the art.

The hardware elements in order to achieve the processing circuitry 805 may be realized by various circuitry elements. Further, each of the functions of the above described embodiments may be implemented by circuitry, which includes one or more processing circuits. A processing circuit includes a particularly programmed processor, for example, processor (CPU) 835, as shown in FIG. 12. A processing circuit also includes devices such as an application specific integrated circuit (ASIC) and conventional circuit components arranged to perform the recited functions.

In FIG. 12, the processing circuitry 805 includes a CPU 835 which performs the processes described above. The processing circuitry 805 may be a general-purpose computer or a particular, special-purpose machine.

Alternatively, or additionally, the CPU 835 may be implemented on an FPGA, ASIC, PLD or using discrete logic circuits, as one of ordinary skill in the art would recognize. Further, CPU 835 may be implemented as multiple processors cooperatively working in parallel to perform the instructions of the inventive processes described above.

The processing circuitry 805 in FIG. 12 also includes a network controller such as an Intel Ethernet PRO network interface card from Intel Corporation of America, for interfacing with network 810 via the network interface 850. As can be appreciated, the network 810 can be a public network, such as the Internet, or a private network such as an LAN or WAN network, or any combination thereof and can also include PSTN or ISDN sub-networks. The network 810 can also be wired, such as an Ethernet network, or can be wireless such as a cellular network including EDGE, 3G and 4G wireless cellular systems. The wireless network can also be Wi-Fi, Bluetooth, or any other wireless form of communication that is known.

The processing circuitry 805 further includes a display controller/display interface 865, such as a graphics card or graphics adaptor for interfacing with display 870, such as a monitor. A peripheral interface 855 interfaces with external devices 860 such as a keyboard, mouse, touch screen panel, etc. Peripheral interface 855 also connects to a variety of peripherals including printers and scanners. A processing circuitry system 800 can include the processing circuitry 805, along with a computer server 830, a cloud storage server 825, a web server 820, and a remote computer 815 which are connected to the processing circuitry 805 via the network 810. A description of the general features and functionality of the display 870, keyboard and/or mouse, as well as the display interface 865, the peripheral interface 855, the network interface 850, the computer server 830, the cloud storage server 825, the web server 820, and the remote computer 815 is omitted herein for brevity as these features are known.

The exemplary circuit elements described in the context of the present disclosure may be replaced with other elements and structured differently than the examples provided herein. Moreover, circuitry configured to perform features described herein may be implemented in multiple circuit units (e.g., chips), or the features may be combined in circuitry on a single chipset.

The functions and features described herein may also be executed by various distributed components of a system. For example, one or more processors may execute these system functions, wherein the processors are distributed across multiple components communicating in a network. The distributed components may include one or more client and server machines, which may share processing, in addition to various human interface and communication devices (e.g., display monitors, smart phones, tablets, personal digital assistants (PDAs)). The network may be a private network, such as a LAN or WAN, or may be a public network, such as the Internet. Input to the system may be received via direct user input and received remotely either in real-time or as a batch process. Additionally, some implementations may be performed on modules or hardware not identical to those described. Accordingly, other implementations are within the scope that may be claimed.

Having now described embodiments of the disclosed subject matter, it should be apparent to those skilled in the art that the foregoing is merely illustrative and not limiting, having been presented by way of example only. Thus, although particular configurations have been discussed herein, other configurations can also be employed. Numerous modifications and other embodiments (e.g., combinations, rearrangements, etc.) are enabled by the present disclosure and are within the scope of one of ordinary skill in the art and are contemplated as falling within the scope of the disclosed subject matter and any equivalents thereto. Features of the disclosed embodiments can be combined, rearranged, omitted, etc., within the scope of the invention to produce additional embodiments. Furthermore, certain features may sometimes be used to advantage without a corresponding use of other features. Accordingly, Applicant(s) intend(s) to embrace all such alternatives, modifications, equivalents, and variations that are within the spirit and scope of the disclosed subject matter.

The exemplary embodiments according to the present disclosure have been described by way of example, and various changes may be made without departing from the scope and spirit of the present disclosure. The exemplary embodiments disclosed above are thus not restrictive, and the true scope and spirit of the present disclosure are defined by the appended claims.

REFERENCE SIGNS LIST

1 Plasma processing apparatus

PS Substrate processing system

W Substrate

EF Layer

PL Protective layer

What is claimed is:

1. An etching method, comprising:
   forming a protective layer on a surface of a side wall defining a recess in a layer of a substrate, the protective layer containing phosphorus; and
   etching the layer to increase a depth of the recess after the forming of the protective layer.

2. The etching method according to claim 1, wherein the forming of the protective layer includes
   forming a precursor layer on the surface of the side wall with a first gas, and
   forming the protective layer from the precursor layer with a second gas, wherein
   the first gas or the second gas contains phosphorus.

3. The etching method according to claim 2, wherein a plurality of layer deposition cycles each including the forming of the precursor layer and the forming of the protective layer from the precursor layer are performed sequentially.

4. The etching method according to claim 3, wherein the plurality of layer deposition cycles include at least one layer deposition cycle in which the forming of the precursor layer is performed under a condition different from a condition under which at least another one of the plurality of layer deposition cycles is performed.

5. The etching method according to claim 3, wherein the plurality of layer deposition cycles include at least one layer deposition cycle in which the forming of the protective layer from the precursor layer is performed under a condition different than in which at least another one of the plurality of layer deposition cycles is performed.

6. The etching method according to claim 2, wherein the first gas contains a phosphorus-containing substance, and
   the second gas contains $H_2O$, an inorganic compound with an N—H bond, a carbon-containing substance, a silicon-containing substance, or a phosphorus-containing substance.

7. The etching method according to claim 2, wherein the first gas contains a carbon-containing substance or a silicon-containing substance, and the second gas contains a phosphorus-containing substance.

8. The etching method according to claim 2, wherein the first gas contains a phosphorus-containing substance, the second gas contains at least one of $H_2$, $O_2$, or $N_2$, and
   the protective layer is formed from the precursor layer receiving a chemical species in plasma generated from the second gas.

9. The etching method according to claim 6, wherein the phosphorus-containing substance contained in the first gas includes a phosphoryl compound, a phosphine substance, a phosphorane compound, a phosphaalkene compound, a phosphaalkyne compound, or a phosphazene compound.

10. The etching method according to claim 6, wherein the phosphorus-containing substance contained in the second gas includes a phosphoryl compound, a phosphine substance, a phosphorane compound, a phosphaalkene compound, a phosphaalkyne compound, or a phosphazene compound.

11. The etching method according to claim 1, wherein the firming includes forming the protective layer by chemical vapor deposition with a layer deposition gas containing a phosphorus-containing substance.

12. The etching method according to claim 11, wherein the phosphorus-containing substance includes a phosphoryl compound, a phosphine substance, a phosphorane compound, a phosphaalkene compound, a phosphaalkyne compound, or a phosphazene compound.

13. The etching method according to claim 11, wherein the layer deposition gas further contains a carbon-containing substance, a silicon-containing substance, $H_2$, $O_2$, $H_2O$, $N_2$, an inorganic compound with an N—H bond, or a noble gas.

14. The etching method according to claim 1, further comprising
   sequentially performing a plurality of cycles that include the forming of the protective layer and the etching of the layer.

15. The etching method according to claim 14, wherein the plurality of cycles include at least one cycle in which the forming of the protective layer is performed under a condition different from a condition under which at least another one of the plurality of cycles is performed.

16. The etching method according to claim 14, wherein the plurality of cycles include at least one cycle in which the etching of the layer is performed under a condition different than in which at least another one of the plurality of cycles is performed.

17. The etching method according to claim 1, wherein the layer includes a silicon-containing layer or an organic layer.

18. A substrate processing system, comprising:
   a layer deposition apparatus configured to form a protective layer containing phosphorus on a surface of a side wall defining a recess in a layer of the substrate; and
   a substrate processing apparatus configured to etch the layer to increase a depth of the recess after the protective layer is formed.

19. An etching method, comprising:
   forming a precursor layer on a surface of a side wall defining a recess in a layer of a substrate, the precursor layer containing phosphorus;
   forming a protective layer from the precursor layer with a chemical species in plasma from a process gas after the forming of the precursor layer; and
   etching the layer with a chemical species different from the chemical species in the plasma from the process gas during the forming of the protective layer.

20. The etching method according to claim 19, wherein the layer includes an organic layer, and
   the process gas contains at least one of $O_2$, $CO_2$, $N_2$, $H_2$, $H_2O$, or an inorganic compound with an N—H bond.

* * * * *